(12) United States Patent
Tseng et al.

(10) Patent No.: US 11,410,932 B2
(45) Date of Patent: Aug. 9, 2022

(54) SEMICONDUCTOR DEVICE AND METHOD OF MANUFACTURING THE SAME

(71) Applicant: Taiwan Semiconductor Manufacturing Co., Ltd., Hsinchu (TW)

(72) Inventors: Ming-Hung Tseng, Miaoli County (TW); Cheng-Chieh Hsieh, Tainan (TW); Hao-Yi Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 19 days.

(21) Appl. No.: 16/833,684

(22) Filed: Mar. 30, 2020

(65) Prior Publication Data

US 2021/0305164 A1 Sep. 30, 2021

(51) Int. Cl.
*H01L 23/538* (2006.01)
*H01L 23/31* (2006.01)
*H01L 23/00* (2006.01)

(52) U.S. Cl.
CPC ...... *H01L 23/5384* (2013.01); *H01L 23/3107* (2013.01); *H01L 23/5386* (2013.01); *H01L 24/94* (2013.01)

(58) Field of Classification Search
CPC . H01L 25/0657; H01L 25/50; H01L 23/5384; H01L 23/3107; H01L 24/94
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2006/0151865 A1* | 7/2006 | Han | H01L 25/0657 257/686 |
| 2007/0205495 A1* | 9/2007 | Fernandez | H01L 23/552 257/686 |

(Continued)

*Primary Examiner* — Jaehwan Oh
*Assistant Examiner* — John M Parker
(74) *Attorney, Agent, or Firm* — JCIPRNET

(57) ABSTRACT

A semiconductor device includes a stacked structure, first conductive terminals and second conductive terminals. The stacked structure includes a first semiconductor component having a first area and a second semiconductor component stacked on the first semiconductor component and having a second area smaller than the first area, wherein an extending direction of the first area and an extending direction of the second area are perpendicular to a stacking direction of the first semiconductor component and the second semiconductor component. The first conductive terminals are located on the stacked structure, electrically coupled to the first semiconductor component and aside of the second semiconductor component. The second conductive terminals are located on the stacked structure and electrically coupled to the second semiconductor component.

20 Claims, 19 Drawing Sheets

(56) References Cited

U.S. PATENT DOCUMENTS

| | | | | |
|---|---|---|---|---|
| 2007/0262467 | A1* | 11/2007 | Birzer | H01L 23/49838 |
| | | | | 257/778 |
| 2008/0265432 | A1* | 10/2008 | O | H01L 25/0657 |
| | | | | 257/777 |
| 2017/0084555 | A1* | 3/2017 | Yu | H01L 24/94 |
| 2017/0207197 | A1* | 7/2017 | Yu | H01L 24/32 |
| 2017/0294413 | A1* | 10/2017 | Shi | H01L 23/3128 |
| 2020/0091114 | A1* | 3/2020 | Hsieh | H01L 24/25 |

* cited by examiner

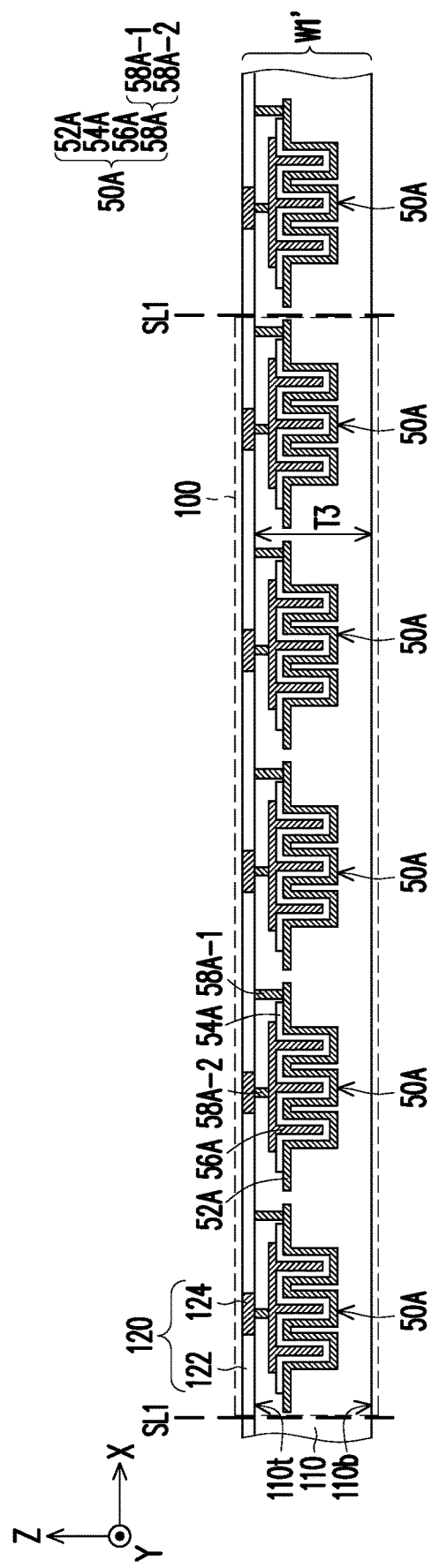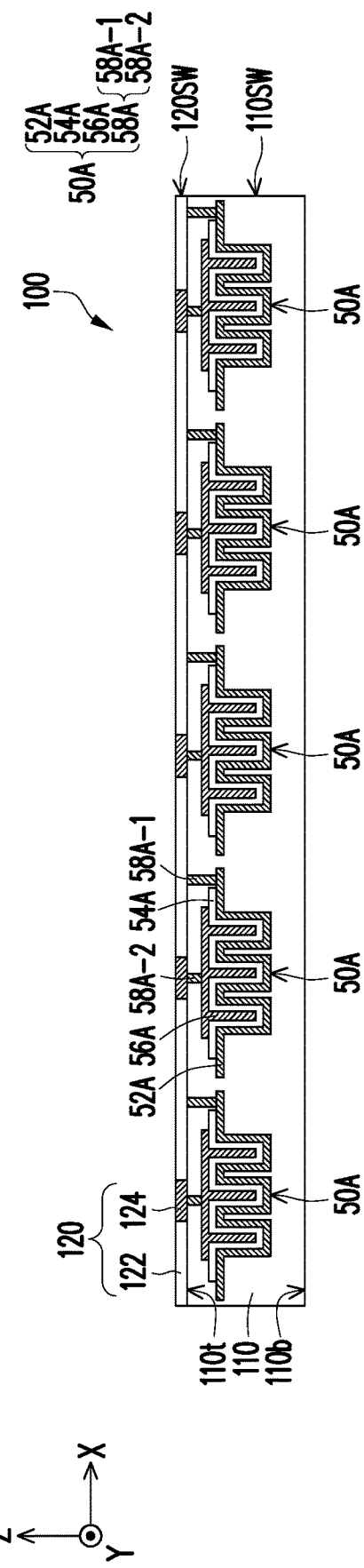

SEMICONDUCTOR DEVICE AND METHOD OF MANUFACTURING THE SAME

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging for ensuring the reliability of packages.

In these semiconductor package applications, capacitors are used for a myriad of purposes on modern ICs. For example, decoupling capacitors are used to decouple one part of an electrical circuit, such as interconnect, from another part of the circuit. In such a configuration, noise arising from the interconnect can be shunted through a decoupling capacitor to reduce the effects of interconnect noise on the remainder of the circuit. Since such capacitors are often placed close to the circuit to eliminate parasitic inductances and resistances associated with the interconnect, there is a need to create a high-density capacitor in either the IC technology of interest or in a stand-alone process that results in an integrated capacitor device easily mountable on the IC.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through FIG. 16 are schematic cross-sectional views of various stages in a manufacturing method of a semiconductor device in accordance with some embodiments of the disclosure.

DETAILED DESCRIPTION

Figure 1:
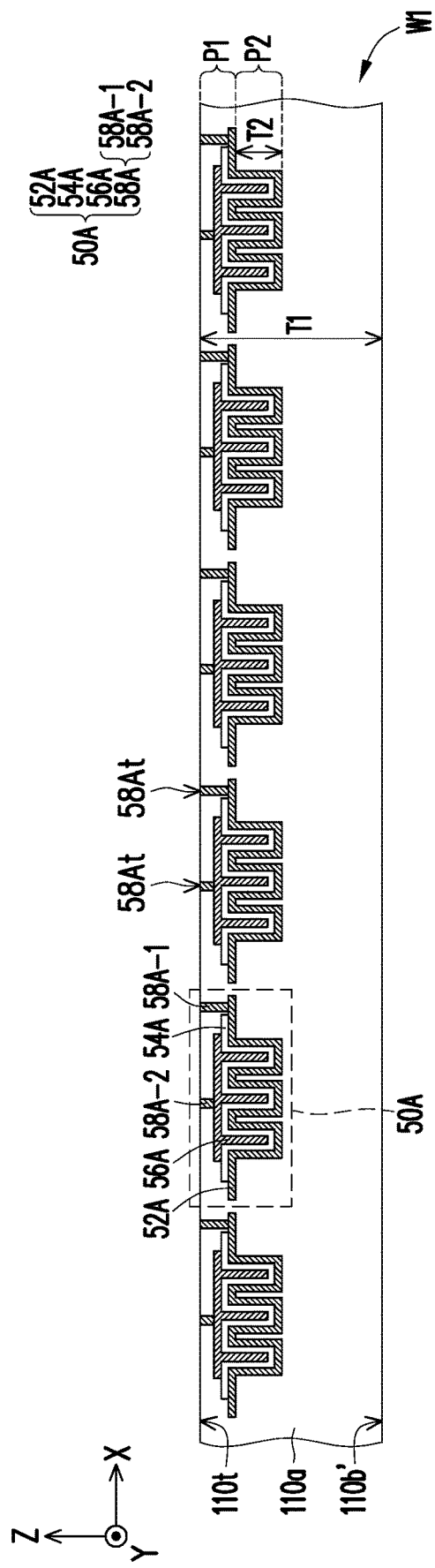

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 16 are schematic cross-sectional views of various stages in a manufacturing method of a semiconductor device in accordance with some embodiments of the disclosure. FIG. 17 to FIG. 20 are schematic top views respectively illustrating a relative position between semiconductor components of a semiconductor device in accordance with some embodiments of the disclosure. In some embodiments, the manufacturing method is part of a wafer-level process. In FIG. 1 to FIG. 16, one semiconductor component is shown to represent plural semiconductor components of the wafer, and one semiconductor device is shown to represent plural semiconductor devices obtained following the (semiconductor) manufacturing method, however the disclosure is not limited thereto. In other embodiments, multiple semiconductor components are shown to represent plural semiconductor components of the wafer, and multiple semiconductor devices are shown to represent plural semiconductor devices obtained following the (semiconductor) manufacturing method.

Referring to FIG. 1, in some embodiments, a semiconductor wafer W1 is provided. For example, the semiconductor wafer W1 includes a semiconductor substrate 110a having semiconductor elements formed therein. In some embodiments, as shown in FIG. 1, the semiconductor elements include capacitors 50A. In other words, the semiconductor wafer W1 may include a plurality of capacitors 50A embedded therein.

In some embodiments, the semiconductor substrate 110a includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 110a includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure. In some embodiments, the alloy SiGe is formed over a silicon substrate. In other embodiments, a SiGe substrate is strained.

The semiconductor substrate 110a may include additional semiconductor element(s) (not shown) formed therein or thereon, where the additional semiconductor element(s) may be or may include passive elements (e.g., capacitors, resistors, inductors, etc.) or other suitable electrical components/elements. The semiconductor substrate 110a may further include a circuitry (not shown) formed therein to provide routing functions among the semiconductor elements (e.g. the capacitors 50A), among the additional semiconductor elements, and/or among the semiconductor elements (e.g. the capacitors 50A) and the additional semiconductor elements.

For example, as shown in FIG. 1, the semiconductor substrate 110a has a top surface 110t and a backside surface 110b' opposite to the top surface 110t along a direction Z, where the capacitors 50A are not accessibly revealed by the backside surface 110b' but the top surface 110t. In some embodiments, a thickness T1 of the semiconductor substrate 110a approximately ranges from 30 μm to 50 μm along a stacking direction (e.g. the direction Z).

On the other hand, the capacitors 50A individually may be a trench capacitor or a deep trench capacitor. In one embodiment, the capacitors 50A each are a metal-insulator-metal (MIM) capacitor. In an alternative embodiment, the capacitors 50A each are a metal-oxide-metal (MOM) capacitor. In some embodiments, the capacitors 50A individually have a capacitance density approximately ranging from 600 nF/mm$^2$ to 1200 nF/mm$^2$. The numbers of the capacitors 50A included in the semiconductor wafer W1 depicted in FIG. 1 is shown for illustrative purposes, and is not intended to limit the scope of the disclosure. Further, in the disclosure, it should be appreciated that the illustration of components throughout all figures is schematic and is not in scale.

In some embodiments, as illustrated in FIG. 1, the capacitors 50A each include a conductive layer 52A, a dielectric layer 54A, a conductive layer 56A, at least one conductive via 58A (e.g., 58A-1 and 58A-2). In some embodiments, the dielectric layer 54A is sandwiched between the conductive layer 52A and conductive layer 56A, where the conductive vias 58A-1 is located on and connected to the conductive layer 52A and the conductive vias 58A-2 is located on and connected to the conductive layer 56A. As shown in FIG. 1, a surface 58At of each of the conductive vias 58A-1 and 58A-2 is substantially coplanar with the top surface 110t of the semiconductor substrate 110a, for example. In other words, the conductive vias 58A-1 and 58A-2 are exposed by the semiconductor substrate 110a for further electrical connections to later-formed conductive connectors, in some embodiments. For example, only one conductive via 58A-1 and one conductive via 58A-2 are shown in FIG. 1 for illustrative purposes, however the disclosure is not limited thereto. The number of each of the conductive vias 58A-1, 58A-2 may be one or more than one. Alternatively, the at least one conductive via 58A-1 may include a plurality of conductive vias 58A-1, and/or the at least one conductive via 58A-2 may include a plurality of conductive vias 58A-2. The materials of the conductive layer 52A, the conductive layer 56A, the conductive vias 58A-1 and the conductive vias 58A-2 may be the same or different, in part or all, the disclosure is not limited thereto. The dielectric layer 54A may be a silicon oxide layer, a silicon nitride layer, a silicon oxy-nitride layer, or other suitable dielectric layer, and may be formed by deposition or the like. The conductive layer 52A, the conductive layer 56A, the conductive vias 58A-1 and the conductive vias 58A-2 independently may be patterned copper layers, patterned aluminum layers or other suitable patterned metal layers, and may be formed by electroplating, deposition or the like. For example, the patterned copper layers are formed through plating process. For another example, the patterned aluminum layers are formed through physical vapor deposition (PVD) process. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, on the X-Y plane, a projection area of the conductive layer 56A is less than a projection area of the conductive layer 52A and is less than a projection area of the dielectric layer 54A, where the projection area of the dielectric layer 54A is less than the projection area of the conductive layer 52A. As shown in FIG. 1, for example, a sidewall of the conductive layer 56A is offset from (e.g., indenting from) a sidewall of the conductive layer 52A and a sidewall of the dielectric layer 54A along a direction X, and the sidewall of the dielectric layer 54A is offset from (e.g., indenting from) the sidewall of the conductive layer 52A along a direction X. In another example, the sidewall of the conductive layer 56A is offset from (e.g., indenting from) the sidewall of the conductive layer 52A and the sidewall of the dielectric layer 54A along a direction Y, and the sidewall of the dielectric layer 54A is offset from (e.g., indenting from) the sidewall of the conductive layer 52A along a direction Y. The direction X and the direction Y are different from each other and are perpendicular to the direction Z, in the disclosure. In some embodiments, on the X-Y plane, the conductive layer 52A is partially exposed by the dielectric layer 54A and the conductive layer 56A, and the conductive layer 56A is exposed from the dielectric layer 54A and the conductive layer 52A, where the conductive via 58A-1 is electrically connected to the exposed portion of the conductive layer 52A, and the conductive via 58A-2 is electrically connected to the exposed portion of the conductive layer 56A.

In some embodiments, the capacitors 50A individually are formed over and in at least one trench (not labeled), where the at least one trench has a depth T2 approximately ranging from 6.0 μm to 7.0 μm along the direction Z. In some embodiments, the capacitors 50A each includes a first portion P1 and a second portion P2, where the second portion P2 includes a part of one capacitor 50A formed in the at least one trench, and the first portion P1 includes other part of the capacitor 50A which is formed over the at least one trench and extended horizontally (along a X-Y plane perpendicular to the direction Z) to connect with the second portion P2. The number of the at least one trenches may be one or more than one, or may be designated based on the demand and/or design layout; the disclosure is not limited thereto. For example, as illustrated in FIG. 1, the capacitors 50A each are formed over and in four trenches for illustrative purposes. In the embodiment of multiple trenches depicted in FIG. 1, two adjacent second portions P2 are connected to one another by one of the first portions P1.

Figure 2:
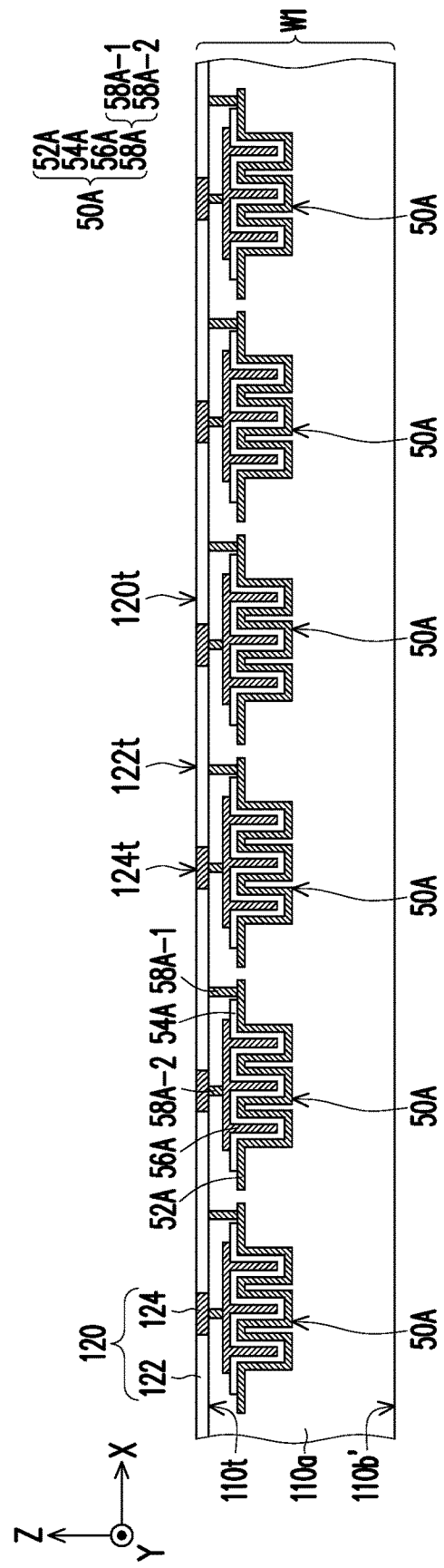

Referring to FIG. 2, in some embodiments, an interconnect structure 120 is formed on the semiconductor substrate 110a. In some embodiments, the interconnect structure 120 includes a dielectric structure 122 and a metallization pattern 124 formed therein. The metallization pattern 124 may include a plurality of conductive segments or conductive patterns. For example, the metallization pattern 124 may include metal lines, metal vias, metal pads, metal traces, or combinations thereof. In some embodiments, as shown in FIG. 2, a top surface 122t of the dielectric layer 122 are substantially coplanar to a top surface 124t of the metallization pattern 124. The high coplanarity at a top surface 120t (including the top surface 122t and the top surface 124t) of the interconnect structure 120 facilitates a formation of a later-formed feature(s). As shown in FIG. 2, for example, the conductive vias 58A-1, 58A-2 exposed by the top surface 110t of the semiconductor substrate 110a are physically and electrically connected to the metallization pattern 124, in some embodiments. In some embodiments, the interconnect structure 120 is electrically connected to the semiconductor elements formed in and/or on the semiconductor substrate 110a (e.g. the capacitors 50A) and further electrically couple the semiconductor elements formed in and/or on the semiconductor substrate 110a (e.g. the capacitors 50A) to external components (e.g., test pads, bonding conductors, connectors, etc.). The interconnect structure 120 provides routing functions for the semiconductor elements formed in the semiconductor substrate 110a, where the aforesaid later-formed conductive connectors are the metallization pattern 124 of the interconnect structure 120. In certain embodiments, it can be said that the semiconductor wafer W1 includes the semiconductor substrate 110a and the interconnect structure 120 located thereon, as shown in FIG. 2.

For example, only one dielectric layer 122 and one layer of the metallization pattern 124 are shown in FIG. 2 for illustrative purposes. For example, the dielectric layer 122 includes a silicon oxide layer, a silicon nitride layer, a silicon oxy-nitride layer, or a dielectric layer formed by other suitable dielectric material. The dielectric layer 122 may be formed by deposition or the like. For example, the metallization pattern 124 are formed of conductive materials such as copper, gold, aluminum, the like, or combinations thereof. The metallization layer 124 may be formed by electroplating, deposition, lamination or the like.

However, the disclosure is not limited thereto. Alternatively, the dielectric structure 122 may include one or more than one dielectric layer, and the metallization pattern 124 may include one or more than one layer of metallization patterns 124. In such embodiments, the dielectric layers 122 and the metallization patterns 124 are formed in alternation, where the metallization patterns 124 formed in different layers are electrically connected to each other, at least in part, to form a circuitry for providing routing functions to the semiconductor elements (e.g., the capacitors 50A) electrically connected thereto.

Referring to FIG. 3, in some embodiments, a planarizing step is performed on the bottom surface 110b' of the semiconductor substrate 110a to form a semiconductor substrate 110. The semiconductor substrate 110 is also referred to as a thin semiconductor substrate or a planarized semiconductor substrate. In some embodiments, a thickness T3 of the semiconductor substrate 110 approximately ranges from 30 µm to 50 µm along the direction Z. In some embodiments, the planarizing step may include a grinding process, a chemical mechanical polishing (CMP) process, or a combination thereof. After the planarizing step, a cleaning step may be optionally performed, for example to clean and remove the residue generated from the planarizing step. However, the disclosure is not limited thereto, and the planarizing step may be performed through any other suitable method. As shown in FIG. 3, for example, after the planarizing step, a semiconductor wafer W1' with a plurality of semiconductor components 100 interconnected to each other is obtained.

In certain embodiments, to facilitate the forgoing processes depicted in FIG. 3, the semiconductor substrate 110a may be temporarily secured with a support (not shown) by placing the interconnect structure 120 onto the support, where the bottom surface 110b' of the semiconductor substrate 110a is facing away from the support for planarizing. However, the disclosure is not limited thereto. In one embodiment, as the thickness T1 of the semiconductor substrate 110a is thick enough to perform the forgoing processes depicted in FIG. 3 without generating damages (e.g. cracks, or broken wafer), the semiconductor substrate 110a may not necessarily be temporarily secured with the support. For example, the support may be an adhesive tape, an adhesive carrier or a suction pad.

Referring to FIG. 3 and FIG. 4, in some embodiments, a dicing process (e.g., singulation) is performed along scribe lines SL1 (indicated by dotted lines in FIG. 3) to cut the semiconductor wafer W1' into singulated and separate semiconductor components 100. In one embodiment, the dicing (singulation) process is a wafer dicing process including mechanical blade sawing or laser cutting, however the disclosure is not limited thereto. Up to here, the semiconductor components 100 are manufactured. In some embodiments, as shown in FIG. 4, the semiconductor components 100 each includes the semiconductor substrate 110, the capacitors 50A embedded in the semiconductor substrate 110 and the interconnect structure 120 disposed on the semiconductor substrate 110 and electrically connected to the capacitors 50A. In the disclosure, the semiconductor components 100 independently may be referred to as a semiconductor integrated device, such as an integrated passive device. For example, only five capacitors 50A included in one semiconductor component 100 is shown in FIG. 4 for illustrative purposes; the disclosure is not limited thereto. The number of the capacitors 50A included in one semiconductor component 100 may be one or more than one, and may be selected and designated based one the demand and design layout. For simplicity, only one semiconductor component 100 is shown in FIG. 4 for illustrative purposes, the disclosure is not limited thereto. As shown in FIG. 4, in the semiconductor component 100, a sidewall 120sw of the interconnect structure 120 is substantially aligned with a sidewall 110sw of the semiconductor substrate 110, for example.

In the embodiments of the support is employed, the support is adopted to secure the whole structure depicted in FIG. 3 for preventing any damages to the semiconductor substrate 110 and/or the interconnect structure 120 due to the singulation (dicing) process. In one embodiment, during the singulation (dicing) process, the support may be partially cut. In an alternative embodiment (not shown), the support may not be cut during the singulation (dicing) process, the disclosure is not limited thereto. After performing the singulation (dicing) process, the support is removed.

In the embodiments of which no support is employed, prior to the singulation (dicing) process, a holding device (not shown) is adopted to secure the whole structure depicted in FIG. 3 for preventing any damages to the semiconductor substrate 110 and/or the interconnect structure 120 due to the singulation (dicing) process. In one embodiment, during the singulation (dicing) process, the holding device may be partially cut. In an alternative embodiment (not shown), the holding device may not be cut during the singulation (dicing) process, the disclosure is not limited thereto. For example, the holding device may be an adhesive tape, an adhesive carrier or a suction pad. After performing the singulation (dicing) process, the holding device is removed.

In one embodiment, a material of the support is the same as a material of the holding device. In an alternative embodiment, the material of the support is different from the material of the holding device.

Figure 5:
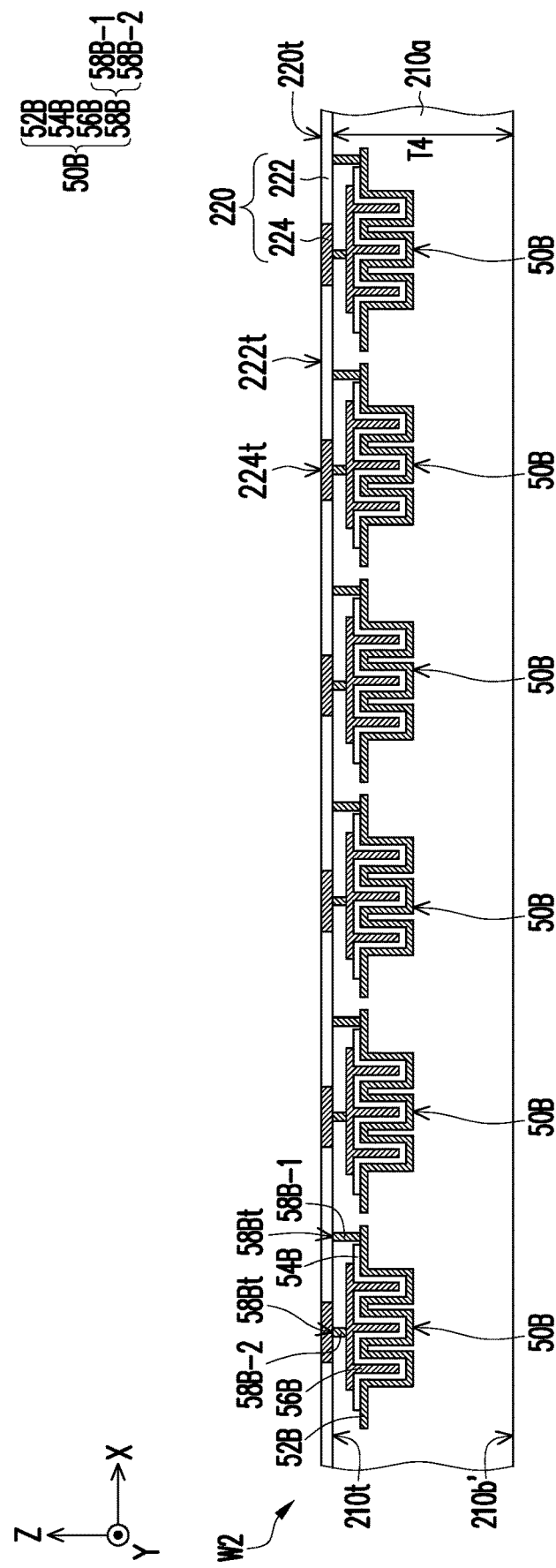

Referring to FIG. 5, in some embodiments, a semiconductor wafer W2 is provided. For example, the semiconductor wafer W2 includes a semiconductor substrate 210a having semiconductor elements formed therein and an interconnect structure 220. In some embodiments, as shown in FIG. 5, the semiconductor elements include capacitors 50B. In other words, the semiconductor wafer W2 may include a plurality of capacitors 50B embedded therein. For example, as shown in FIG. 5, the semiconductor substrate 210a has a top surface 210t and a backside surface 210b' opposite to the top surface 210t along the direction Z, where the capacitors 50B are not accessibly revealed by the backside surface 210b' but the top surface 210t. In some embodiments, a material and the detail of the semiconductor substrate 210a are the same as the material and the detail of the semiconductor substrate 110a as described in FIG. 1, and thus are not repeated herein for brevity. In some embodiments, a thickness T4 of the semiconductor substrate 210a approximately ranges from 700 µm to 800 µm along the direction Z.

In some embodiments, the capacitors 50B individually may be a trench capacitor or a deep trench capacitor. In one embodiment, the capacitors 50B each are a MIM capacitor. In an alternative embodiment, the capacitors 50B each are a MOM capacitor. In some embodiments, the capacitors 50B individually have a capacitance density approximately ranging from 600 $nF/mm^2$ to 1200 $nF/mm^2$. The numbers of the capacitors 50B included in the semiconductor wafer W2 depicted in FIG. 5 is shown for illustrative purposes, and is not intended to limit the scope of the disclosure. In some embodiments, as illustrated in FIG. 5, the capacitors 50B each include a conductive layer 52B, a dielectric layer 54B, a conductive layer 56B, at least one conductive via 58B (e.g., 58B-1 and 58B-2). The formation and material and the detail of components of the capacitors 50B may be similar to or the same as the formation and material and the detail of components of the capacitors 50A as described in FIG. 1, and thus are not repeated herein for brevity.

As shown in FIG. 5, a surface 58Bt of each of the conductive vias 58B-1 and 58B-2 is substantially coplanar with the top surface 210t of the semiconductor substrate 210a, for example. In other words, the conductive vias 58B-1 and 58B-2 are exposed by the semiconductor substrate 210a for further electrical connections to later-formed conductive connectors, in some embodiments. In some embodiments, on the X-Y plane, a projection area of the conductive layer 56B is less than a projection area of the conductive layer 52B and is less than a projection area of the dielectric layer 54B, where the projection area of the dielectric layer 54B is less than the projection area of the conductive layer 52B. In some embodiments, on the X-Y plane, the conductive layer 52B is partially exposed by the dielectric layer 54B and the conductive layer 56B, and the conductive layer 56B is exposed from the dielectric layer 54B and the conductive layer 52B, where the conductive via 58B-1 is electrically connected to the exposed portion of the conductive layer 52B, and the conductive via 58B-2 is electrically connected to the exposed portion of the conductive layer 56B.

Continued on FIG. 5, in some embodiments, the interconnect structure 220 is formed on the semiconductor substrate 210a, where the interconnect structure 220 includes at least one dielectric layer 222 and at least one layer of a metallization pattern 224. The formation and material and the detail of components of the interconnect structure 220 may be similar to or the same as the formation and material and the detail of components of the interconnect structure 120 as described in FIG. 2, and thus are not repeated herein for brevity. The high coplanarity at a top surface 220t (including a top surface 222t and a top surface 224t) of the interconnect structure 220 facilitates a formation of a later-formed feature(s). As shown in FIG. 5, for example, the conductive vias 58B-1, 58B-2 exposed by the top surface 210t of the semiconductor substrate 210a are physically and electrically connected to the metallization pattern 224, in some embodiments. In some embodiments, the interconnect structure 220 is electrically connected to the semiconductor elements formed in and/or on the semiconductor substrate 110a (e.g. the capacitors 50B) and further electrically couple the semiconductor elements formed in and/or on the semiconductor substrate 110a (e.g. the capacitors 50B) to external components (e.g., test pads, bonding conductors, connectors, etc.). The interconnect structure 220 provides routing functions for the semiconductor elements formed in the semiconductor substrate 210a, where the aforesaid later-formed conductive connectors are the metallization pattern 224 of the interconnect structure 220.

Figure 6:
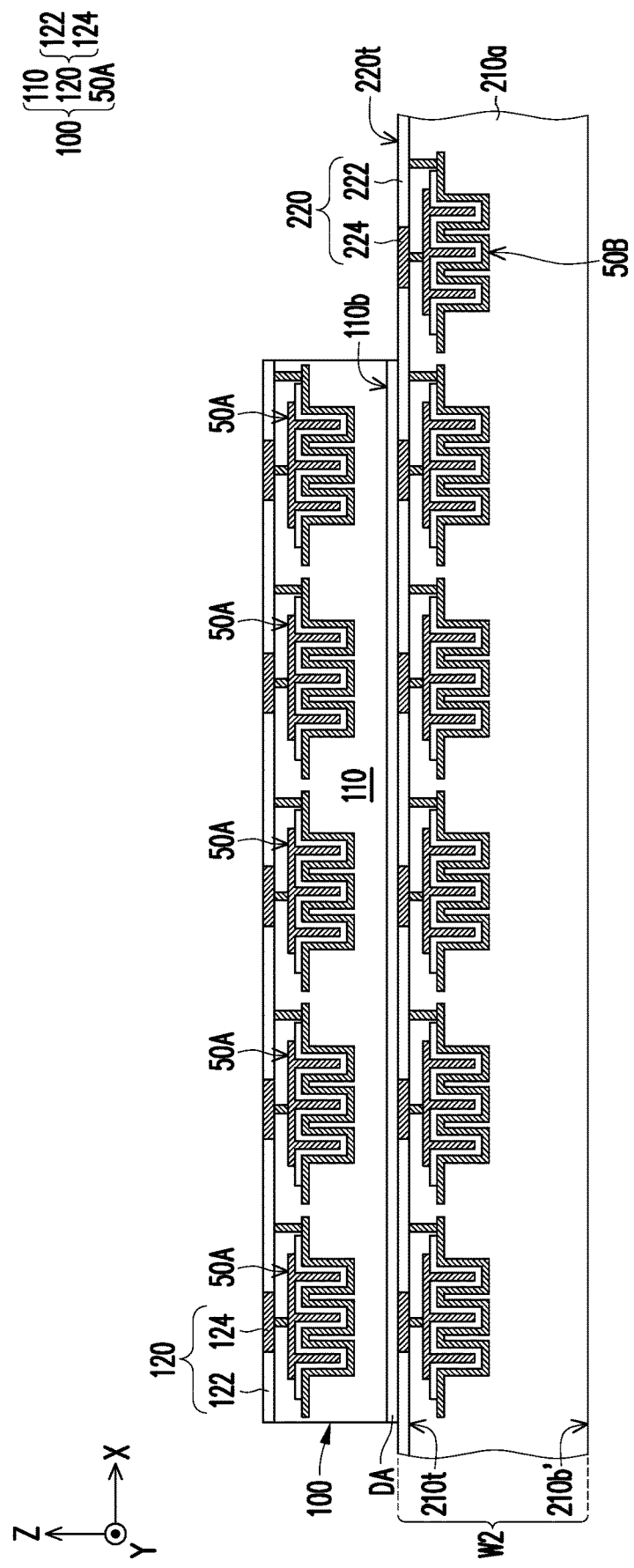

Referring to FIG. 6, in some embodiments, at least one semiconductor component 100 is provided and placed on the semiconductor wafer W2. For example, the semiconductor component 100 is picked-up and placed on the interconnect structure 220 of the semiconductor wafer W2, and is attached or adhered on the interconnect structure 220 through a connecting film DA. In some embodiments, the connecting film DA is located between the semiconductor component 100 and the interconnect structure 220, where the connecting film DA physically contacts the backside surface 110b of the semiconductor component 100 and the top surface 220t of the interconnect structure 220. Due to the connecting film DA, the semiconductor component 100 and the interconnect structure 220 are stably adhered to each other. In some embodiments, the connecting film DA may be, for example, a die attach film, a layer made of adhesives or epoxy resin, or the like. The detail of the semiconductor component 100 is provided and described in conjunction with FIG. 1 through FIG. 4, and thus are not repeated herein. As shown in FIG. 6, for example, a portion of the interconnect structure 220 (e.g. a portion of the metallization pattern 224 and a portion of the dielectric structure 222) is exposed by the semiconductor component 100. In some embodiments, the bottom surface 110b is completely covered by the connecting film DA on the X-Y plane, where the semiconductor substrate 110 is sandwiched between the interconnect structure 120 and the connecting film DA.

In one embodiment, the capacity density of one capacitor 50A is the same as the capacity density of one capacitor 50B. However, the disclosure is not limited thereto; alternatively, the capacity density of one capacitor 50A is different from the capacity density of one capacitor 50B.

Figure 7:
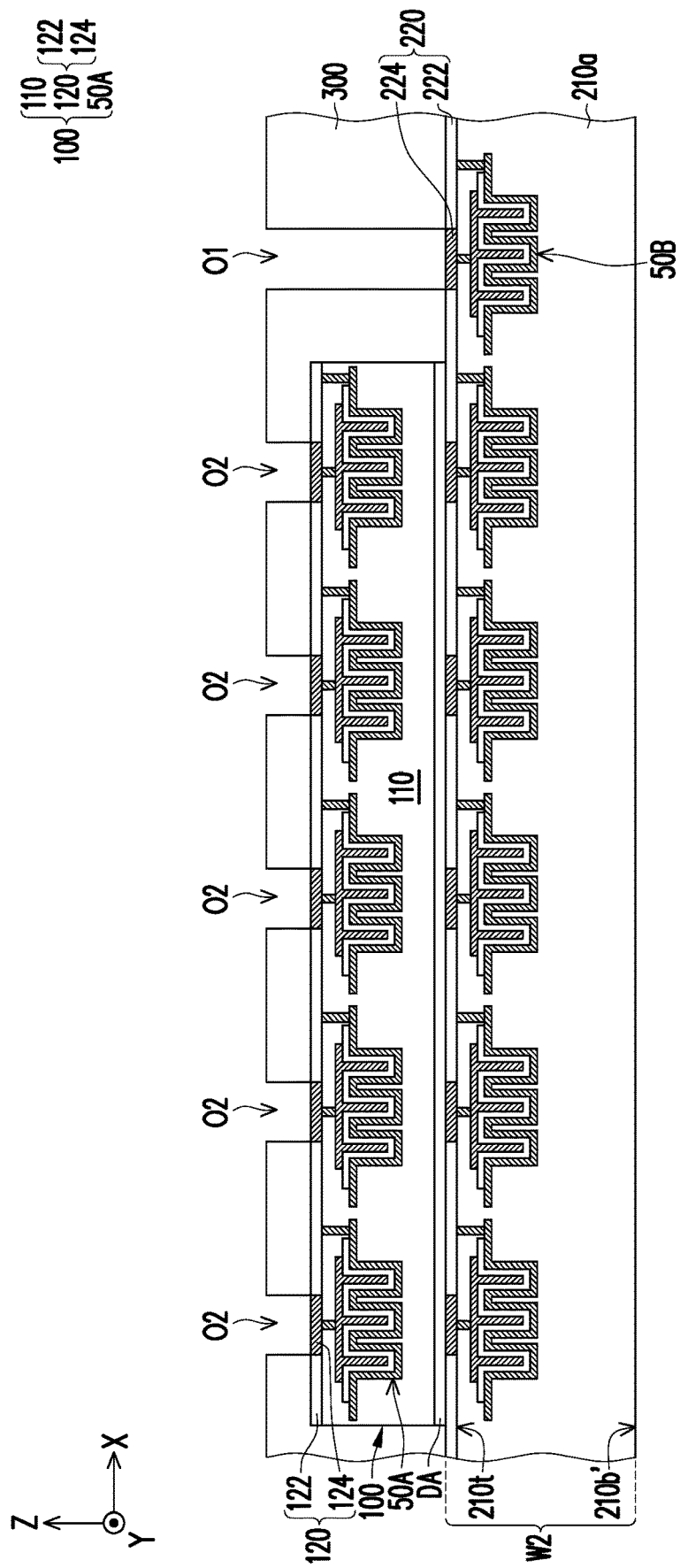

Referring to FIG. 7, in some embodiments, a dielectric layer 300 is formed over the semiconductor component 100 and the semiconductor wafer W2 exposed by the semiconductor component 100. For example, the dielectric layer 300 is formed by, but not limited to, forming a blanket layer of a dielectric material over the structure depicted in FIG. 6 to extend over and cover the semiconductor component 100, the connecting film DA and the semiconductor wafer W2 exposed therefrom, and then patterning the dielectric material blanket layer to form the dielectric layer 300 with at least one opening hole O1 and at least one opening hole O2. For example, only one opening hole O1 and five opening holes O2 are presented in FIG. 7 for illustrative purposes, the disclosure is not limited thereto. The number of each of the opening holes O1 and O2 independently should be more than one, and may be selected and designated based on the demand and design layout (e.g. may correspond to the number of later-formed conductive structure(s), such as a conductive pillar, a conductive via, a conductive trace, or a conductive segment).

A material of the dielectric layer 300 may include a photosensitive dielectric material. For example, the photosensitive dielectric material includes polyimide (PI), polybenzoxazole (PBO), benzocyclobutene (BCB), combinations thereof, or other suitable photosensitive dielectric material. In some embodiments, the dielectric layer 300 may be formed, for example, by a spin coat method, a dip coat method, or lamination, or a suitable coating method. For example, the photosensitive dielectric material is dispensed as a liquid and cured over the structure depicted in FIG. 6, where a pre-baking (or called soft baking) process is then performed thereon to facilitate the formation of the blanket dielectric layer for a sequential patterning process. For another example, the photosensitive dielectric material is in a form of a laminate film which is laminated onto the structure depicted in FIG. 6 for a sequential patterning process. The disclosure is not limited thereto. An illustrated top surface of the dielectric layer 300 shown in FIG. 7 may be flat and may have a high degree of coplanarity. The patterning process includes a photolithography process (involving steps of exposure and development, in sequence). Optionally, during the photolithography process, a post exposure baking ((PEB), or called hard baking) step may be performed after the development. In certain embodiments, no filler is presented in the dielectric layer 300.

Continued on FIG. 7, in some embodiments, the opening hole O1 is corresponding to (e.g. overlapped with in the direction Z) the metallization pattern 224 of the interconnect structure 220 exposed by the semiconductor component 100 and the connecting film DA, and the opening holes O2 are corresponding to (e.g. overlapped with in the direction Z) the metallization pattern 124 of the interconnect structure 120. For example, as shown in FIG. 7, the metallization pattern 224 exposed by the semiconductor component 100 and the metallization pattern 124 are accessibly revealed by the dielectric layer 300 (via the opening holes O1 and O2, respectively). In some embodiments, a sidewall of the semiconductor component 100 and a sidewall of the connecting film DA are completely wrapped (covered) by the dielectric layer 300.

In some embodiments, along the direction Z, a depth of the opening hole O1 is greater than a depth of each of the opening holes O2. That is, a thickness of the dielectric layer 300 is greater than the thickness T3 of the semiconductor component 100. In one embodiment, on the X-Y plane, a projection area of the opening hole O1 is substantially equal to a projection area of each of the opening holes O2. In another embodiment, on the X-Y plane, a projection area of the opening hole O1 is greater than a projection area of each of the opening holes O2. In yet another embodiment, on the X-Y plane, a projection area of the opening hole O1 is less than a projection area of each of the opening holes O2. In some embodiments, as shown in FIG. 7, a sidewall of the opening hole O1 is vertical in reference with the direction Z. However, the disclosure is not limited thereto; alternatively, the sidewall of the opening hole O1 may be vertical in reference with the direction Z. In some embodiments, as shown in FIG. 7, a sidewall of each of the opening holes O2 is vertical in reference with the direction Z. Alternatively, the sidewall of each of the opening holes O2 may be vertical in reference with the direction Z.

Figure 8:
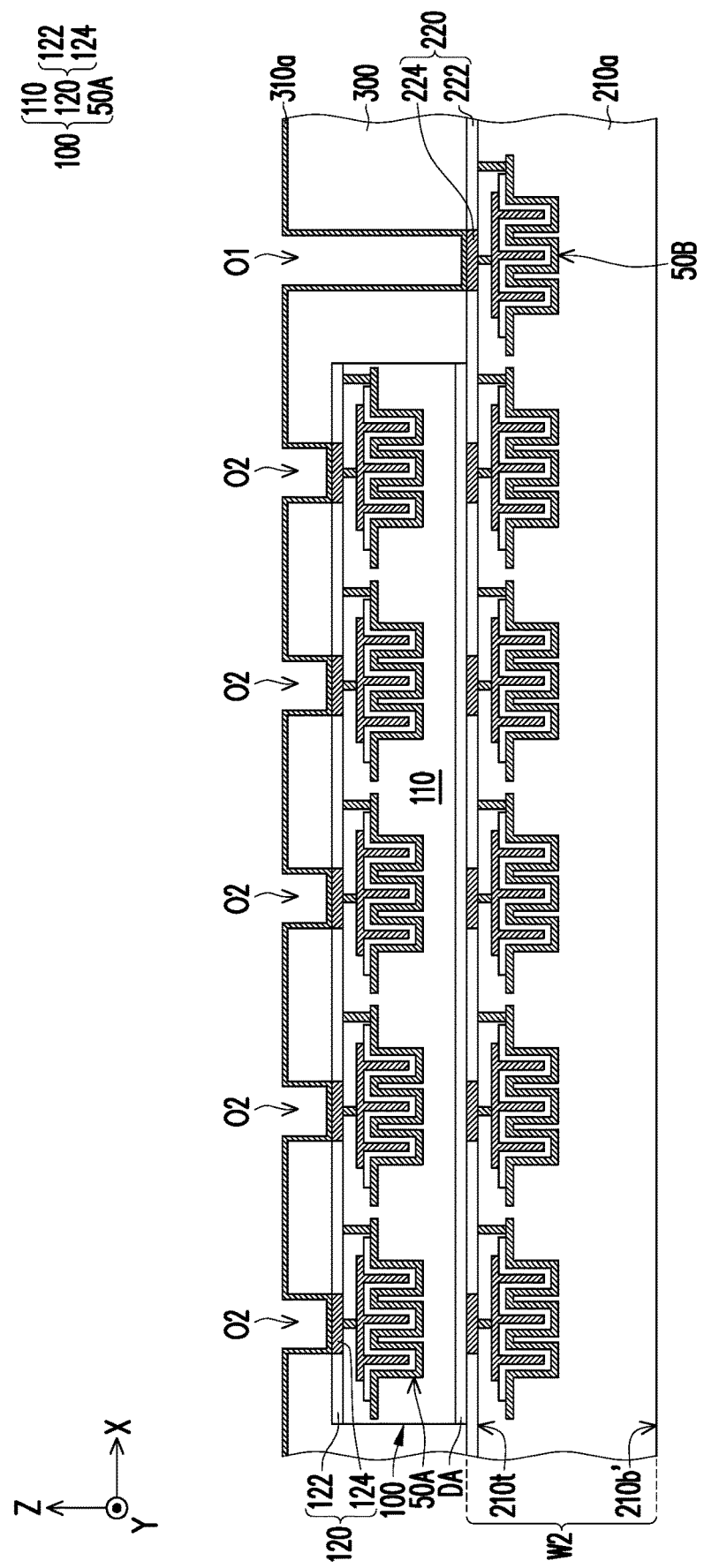

Referring to FIG. 8, in some embodiments, a seed layer material 310a is formed on the dielectric layer 300 and over the semiconductor component 100 and the semiconductor wafer W2. In some embodiments, the seed layer material 310a extends into the opening holes O1 and O2 formed in the dielectric layer 300 to physically contact the metallization pattern 224 exposed by the opening hole O1 and the metallization pattern 124 exposed by the opening holes O2. In other words, the seed layer material 310a penetrates through the dielectric layer 300, and the sidewall of the opening hole O1 and the sidewalls of the opening holes O2 are completely covered by the seed layer material 310a.

In some embodiments, the seed layer material 310a is conformally formed over the semiconductor wafer W2 in a manner of a blanket layer made of metal or metal alloy materials, the disclosure is not limited thereto. In some embodiments, the seed layer material 310a are referred to as a metal layer, which may be a single layer or a composite layer comprising a plurality of sub-layers formed of different materials. In some embodiments, the seed layer material 310a include titanium, copper, molybdenum, tungsten, titanium nitride, titanium tungsten, combinations thereof, or the like. For example, the seed layer material 310a may include a titanium layer and a copper layer over the titanium layer. The seed layer material 310a may be formed using, for example, sputtering, PVD, or the like. In some embodiments, the seed layer material 310a may be conformally formed on the dielectric layer 300 by sputtering, and in contact with the dielectric layer 300, the semiconductor component 100 exposed by the opening holes O2 and the semiconductor wafer W2 exposed by the opening hole O1. In some embodiments, the seed layer material 310a is electrically connected to the capacitors 50A included in the semiconductor component 100 via physically connecting the metallization pattern 124 accessibly revealed by the dielectric layer 300 through the opening holes O2 and is electrically connected to the capacitors 50B included in the semiconductor wafer W2 via physically connecting the metallization pattern 224 accessibly revealed by the dielectric layer 300 through the opening hole O1.

Figure 9:
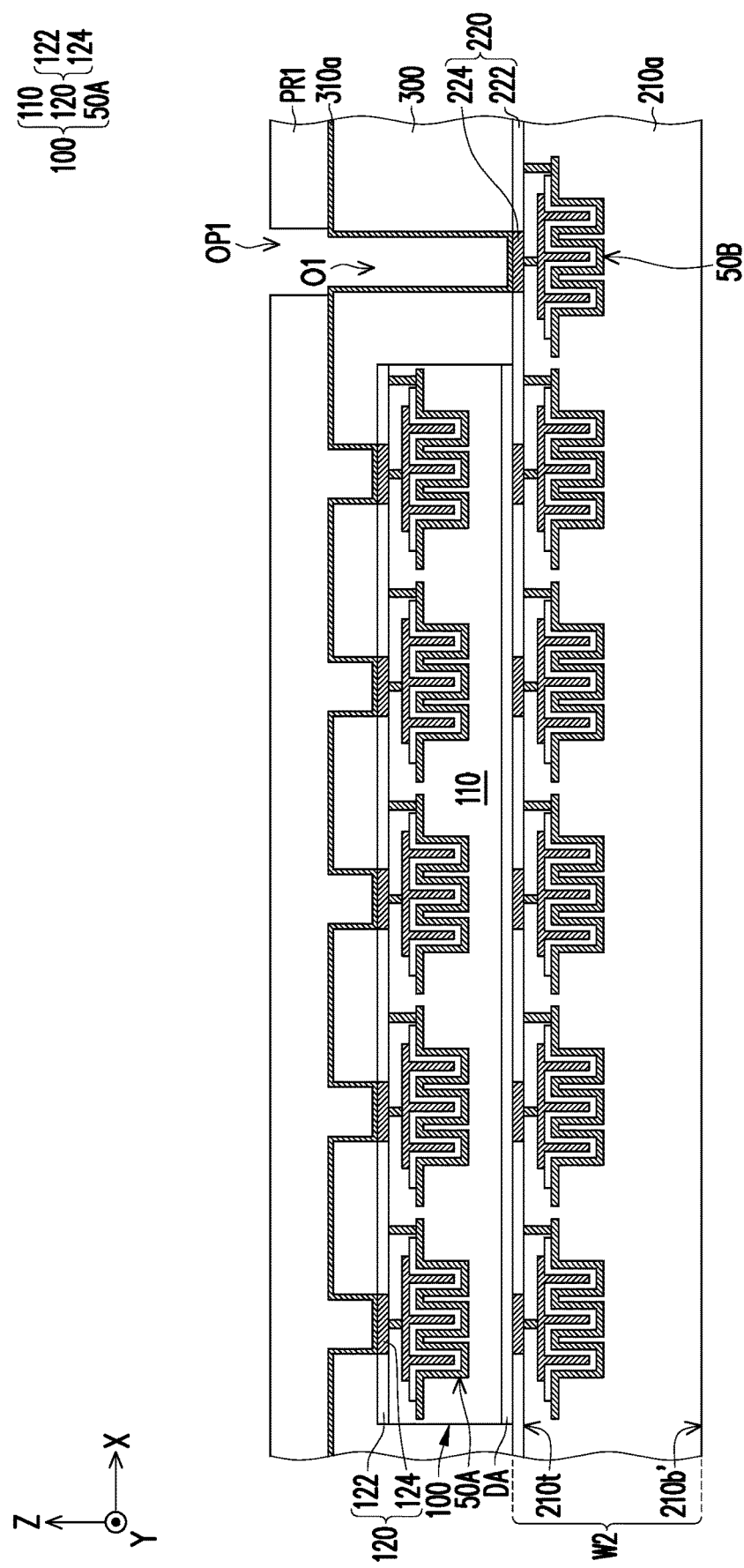

Referring to FIG. 9, in some embodiments, a resist layer PR1 is formed on the seed layer material 310a, where the resist layer PR1 includes at least one opening OP1. For example, a position location of the opening OP1 is overlapped with a position location of the opening hole O1 along the direction Z on X-Y plane. In some embodiments, one opening OP1 is corresponding to (e.g. overlapped with) one opening hole O1, where the seed layer material 310a extended into the opening hole O1 is exposed by a corresponding one opening OP1 formed in the resist layer PR1, and the seed layer material 310a extended into the opening holes O2 are covered by the resist layer PR1, as shown in FIG. 9. In other words, the number of the opening OP1 is the same as the number of the opening hole O1. For example, only one opening OP1 is shown in FIG. 9 for illustrative purposes, however the disclosure is not limited thereto. The number and shape of the opening OP1 formed in the resist layer PR1 are correspond to the number and shape of the opening hole O1 formed in the dielectric layer 300, which can be adjusted by changing the number and shape of the opening hole O1.

In one embodiment, the resist layer PR1 may be formed by coating and photolithography processes or the like; however, the disclosure is not limited thereto. In some embodiments, a material of the resist layer PR1, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the resist layer PR1 is referred to as a photoresist layer. As shown in FIG. 1, for example, along the direction X and the direction Y (such as on the X-Y plane), a size of the opening OP1 formed in the resist layer PR1 is greater than a size of the opening hole O1 formed in the dielectric layer 300.

Figure 10:
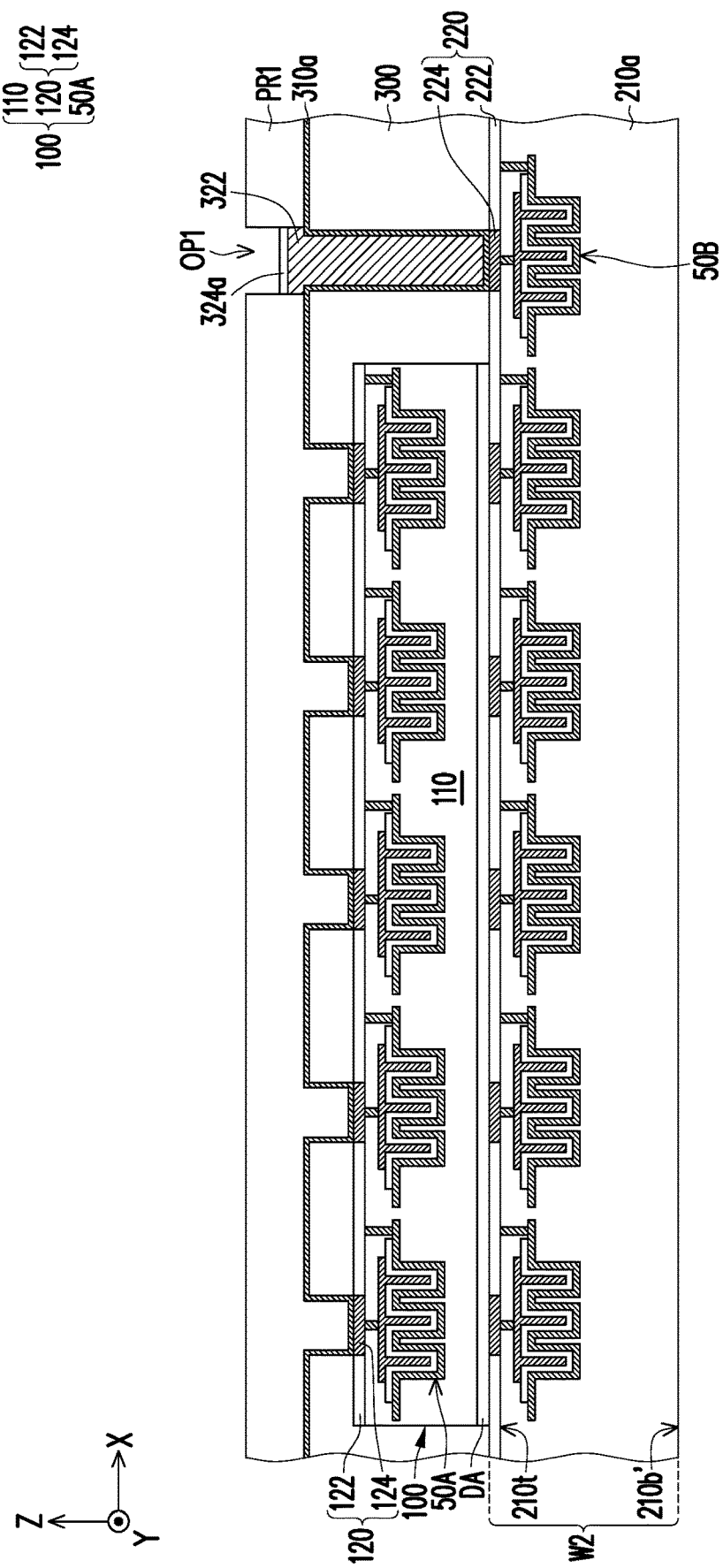

Referring to FIG. 10, in some embodiments, at least one conductive via 322 is formed in the opening hole O1, and a solder material pattern 324a is formed on the conductive via 322. For example, the conductive via 322 is physically connected to the seed layer material 310a exposed by the opening OP1, and the solder material pattern 324a is physically connected to the conductive via 322. In some embodiments, the conductive via 322 is electrically connected to the solder material pattern 324a. In some embodiments, the solder material pattern 324a is located inside the opening OP1, while a part of the conductive via 322 is located inside the opening OP1 and other part of the conductive via 322 is located inside the opening hole O1. In one embodiment, as shown in FIG. 10, a portion of the conductive via 322 located outside the opening hole O1 has a size greater than a size of the conductive via 322 located inside the opening hole O1 along a horizontal direction (such as the direction X and/or the direction Y). However, the disclosure is not limited thereto; alternatively, the portion of the conductive via 322 located outside the opening hole O1 may have a size substantially equal to a size of the conductive via 322 located inside the opening hole O1 along the horizontal direction.

As shown in FIG. 10, for example, along the direction Z, a thickness of the conductive via 322 is greater than a thickness of the semiconductor component 100, and is greater than a thickness of the solder material pattern 324a. In some embodiments, the conductive via 322 is electrically coupled to the semiconductor wafer W2 (e.g., the capacitors 50B) through the seed layer material 310a and the metallization patterns 224. In some embodiments, the conductive via 322 is located between the solder material pattern 324a and the seed layer material 310a.

For example, only one conductive via 322 is presented in FIG. 10 for illustrative purposes, however, the disclosure is not limited thereto. The number and shape of the conductive via 322 can be selected based on the demand, and adjusted by changing the number and shape of the opening hole O1 formed in the dielectric layer 300 and the opening OP1 corresponding to the opening hole O1 and formed in the resist layer PR1. In some embodiments, for the formation of the conductive via 322, a conductive material (not shown) is formed to fill into the opening OP1 formed in the resist layer PR1 and the opening hole O1 formed in the dielectric layer 300 by a plating process. The plating process is, for example, electro-plating, electroless-plating, immersion plating, or the like. In some embodiments, the conductive material includes, for example, copper, copper alloys, or the like.

For example, only one solder material pattern 324a is presented in FIG. 10 for illustrative purposes, however, the disclosure is not limited thereto. The number and shape of the solder material pattern 324a are corresponding to the number and shape of the conductive via 322, which can be adjusted by changing the number and shape of the conductive via 322. In some embodiments, after the formation of the conductive via 322, the solder material pattern 324a is formed on the conductive via 322 by forming a layer of solder material via a plating process. In some embodiments, the solder material may include a lead-free solder material (such as Sn—Ag base or Sn—Ag—Cu base materials) with or without additional impurity (such as Ni, Bi, Sb, Au, or the like). The disclosure is not limited thereto. In alternative embodiments, a layer of solder material may be formed through evaporation, printing, solder transfer, ball placement, or the like.

Figure 11:
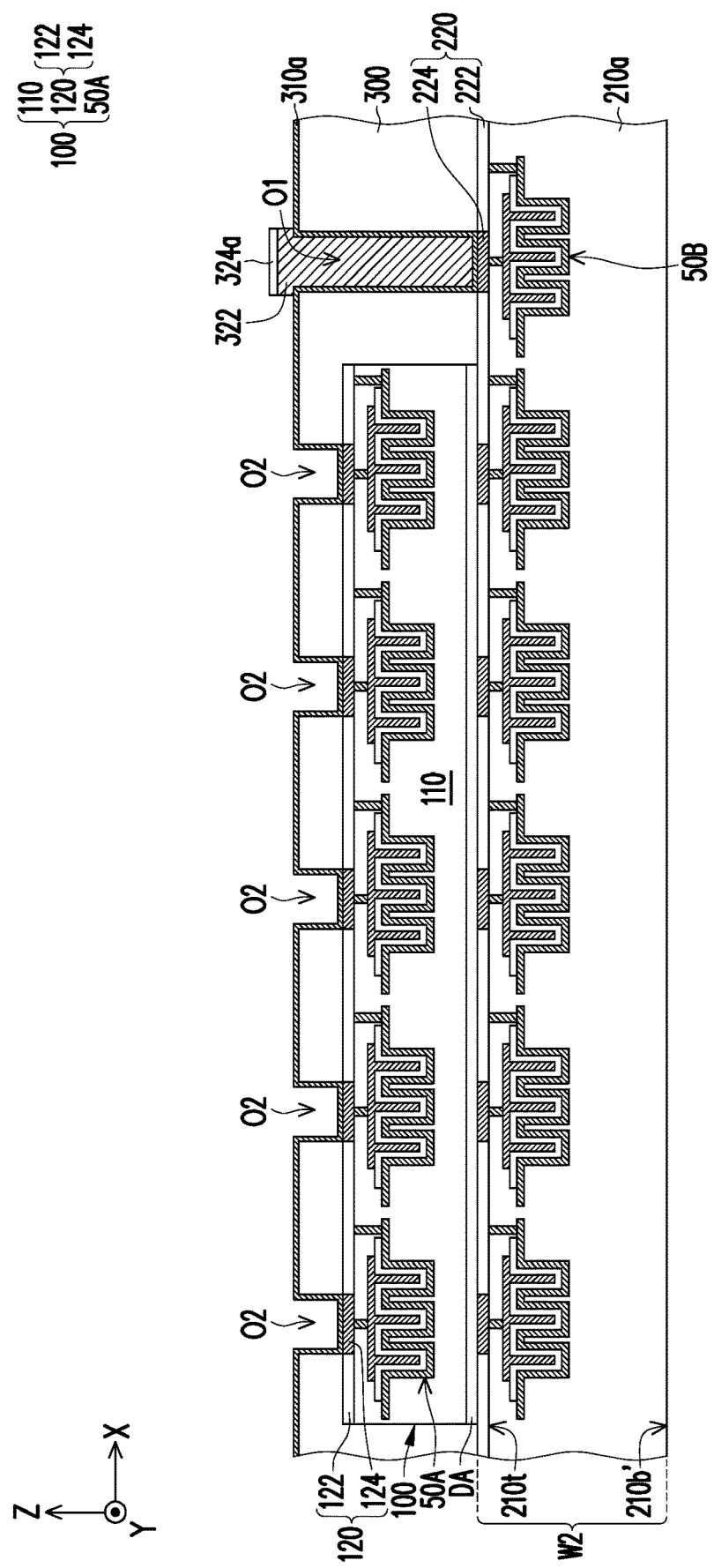

Referring to FIG. 10 and FIG. 11, in some embodiments, after the conductive via 322 and the solder material pattern 324a are formed, the resist layer PR1 is removed from the seed layer material 310a. In some embodiments, a portion of the seed layer materials 310a not covered by the conductive via 322 and the solder material pattern 324a is exposed. In some embodiments, the resist layer PR1 is removed by acceptable ashing process and/or photoresist stripping process, such as using an oxygen plasma or the like. The disclosure is not limited thereto.

Figure 12:
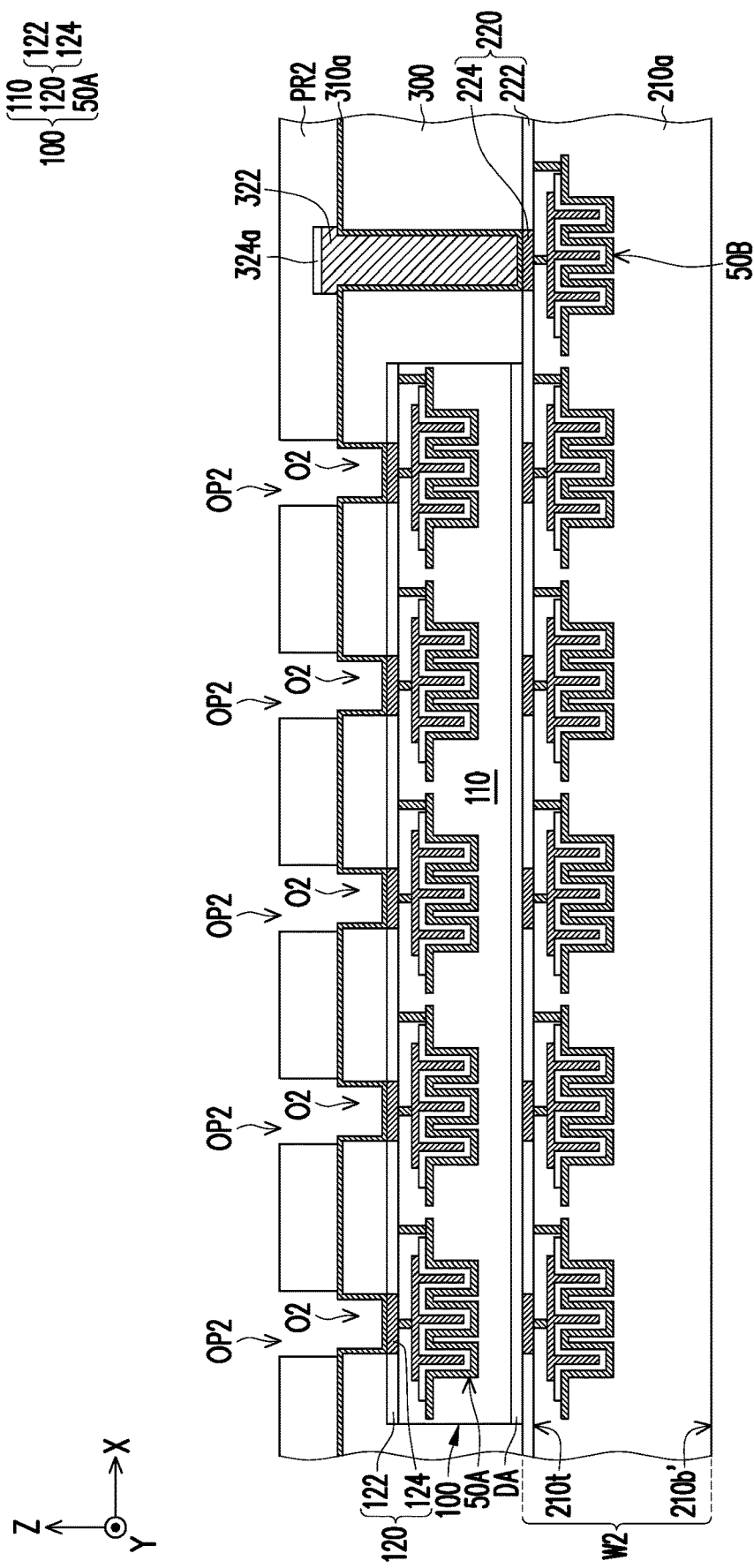

Referring to FIG. 12, in some embodiments, a resist layer PR2 is formed on the seed layer material 310a, the conductive via 322 and the solder material pattern 324a, where the resist layer PR2 includes at least one opening OP2. For example, position locations of the openings OP2 is overlapped with position locations of the opening hole O2 along the direction Z on X-Y plane. In some embodiments, one opening OP2 is corresponding to (e.g. overlapped with) one opening hole O2, where the seed layer material 310a extended into the opening hole O2 is exposed by a corresponding one opening OP2 formed in the resist layer PR2, and the rest of the seed layer material 310a along with the conductive via 322 and the solder material pattern 324a are covered by the resist layer PR2, as shown in FIG. 12. In other words, the number of the openings OP2 is the same as the number of the opening holes O2. For example, only five opening OP2 is shown in FIG. 12 for illustrative purposes, however the disclosure is not limited thereto. The number and shape of the openings OP2 formed in the resist layer PR2 are correspond to the number and shape of the opening holes O2 formed in the dielectric layer 300, which can be adjusted by changing the number and shape of the opening holes O2.

The formation and material of the resist layer PR2 are similar to or the same as the formation and material of the resist layer PR1 as described in FIG. 9, and thus are not repeated therein. In one embodiment, the material of the resist layer PR2 is the same as the material of the resist layer PR1. In an alternative embodiment, the material of the resist layer PR2 is different from the material of the resist layer PR1. In the disclosure, the resist layer PR2 is referred to as a photoresist layer. As shown in FIG. 12, for example, along the direction X and the direction Y (such as on the X-Y plane), a size of the openings OP2 formed in the resist layer PR2 is greater than a size of a corresponding one opening hole O2 formed in the dielectric layer 300 underlying thereto.

Figure 13:
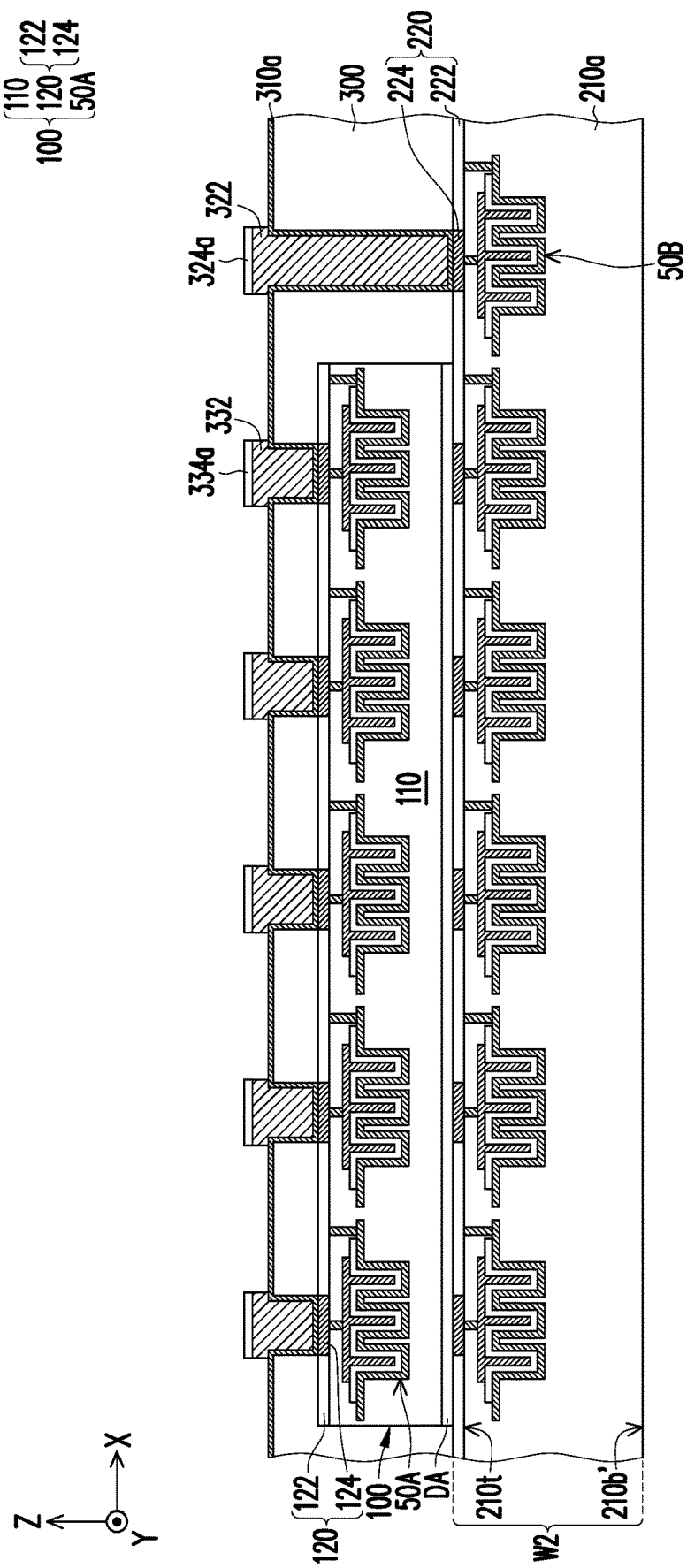

Referring to FIG. 13, in some embodiments, a plurality of conductive vias 332 are respectively formed in the opening holes O2, and a plurality of solder material patterns 334a are respectively formed on the conductive vias 332. For example, the conductive vias 332 are physically connected to the seed layer material 310a exposed by the openings OP2, and the solder material patterns 334a are physically connected to the conductive vias 332 respectively underlying thereto. In some embodiments, the conductive vias 332 are electrically connected to the solder material pattern 334a. In some embodiments, the solder material patterns 334a are located inside the openings OP2, while the conductive vias 332 are partially located inside the openings OP2 and are partially located inside the opening holes O2. In one embodiment, as shown in FIG. 13, for each of the conductive vias 332, a portion of the conductive via 332 located outside a respective one opening hole O2 has a size greater than a size of the conductive via 332 located inside the respective one opening hole O2 along a horizontal direction (such as the direction X and/or the direction Y). However, the disclosure is not limited thereto; alternatively, a portion of the conductive via 332 located outside a respective one opening hole O2 may have a size substantially equal to a size of the conductive via 332 located inside the respective one opening hole O2 along the horizontal direction.

As shown in FIG. 13, for example, along the direction Z, a thickness of each of the conductive vias 332 is less than the thickness of the conductive via 322 and is greater than a thickness of each of the solder material pattern 334a. As shown in FIG. 13, for example, the conductive vias 332 are electrically coupled to the semiconductor component 100 (e.g., the capacitors 50A) through the seed layer material 310a and the metallization patterns 124. In some embodiments, the conductive vias 332 are located between the solder material patterns 334a and the seed layer material 310a.

For example, only five conductive vias 335 and five older material patterns 334a are presented in FIG. 13 for illustrative purposes, however, the disclosure is not limited thereto. The number and shape of the conductive vias 332 can be selected based on the demand, and adjusted by changing the number and shape of the opening holes O2 formed in the dielectric layer 300 and the openings OP2 corresponding to the opening holes O2 and formed in the resist layer PR2. The number and shape of the solder material patterns 334a are corresponding to the number and shape of the conductive vias 332, which can be adjusted by changing the number and shape of the conductive vias 332. For example, the formation and material of the conductive vias 322 are similar to or the formation and material of the conductive via(s) 322 as described in FIG. 10, the formation and material of the solder material patterns 334a are similar to or the formation and material of the solder material pattern(s) 324a as described in FIG. 10, and thus are not repeated herein for brevity.

Continued on FIG. 13, after the conductive vias 332 and the solder material patterns 334a are formed, the resist layer PR2 is removed from the seed layer material 310a. In some embodiments, a portion of the seed layer materials 310a not covered by the conductive via 322, the solder material pattern 324a, the conductive vias 332 and the solder material pattern 334a are exposed. In some embodiments, the resist layer PR2 is removed by acceptable ashing process and/or photoresist stripping process, such as using an oxygen plasma or the like. The disclosure is not limited thereto.

Figure 14:
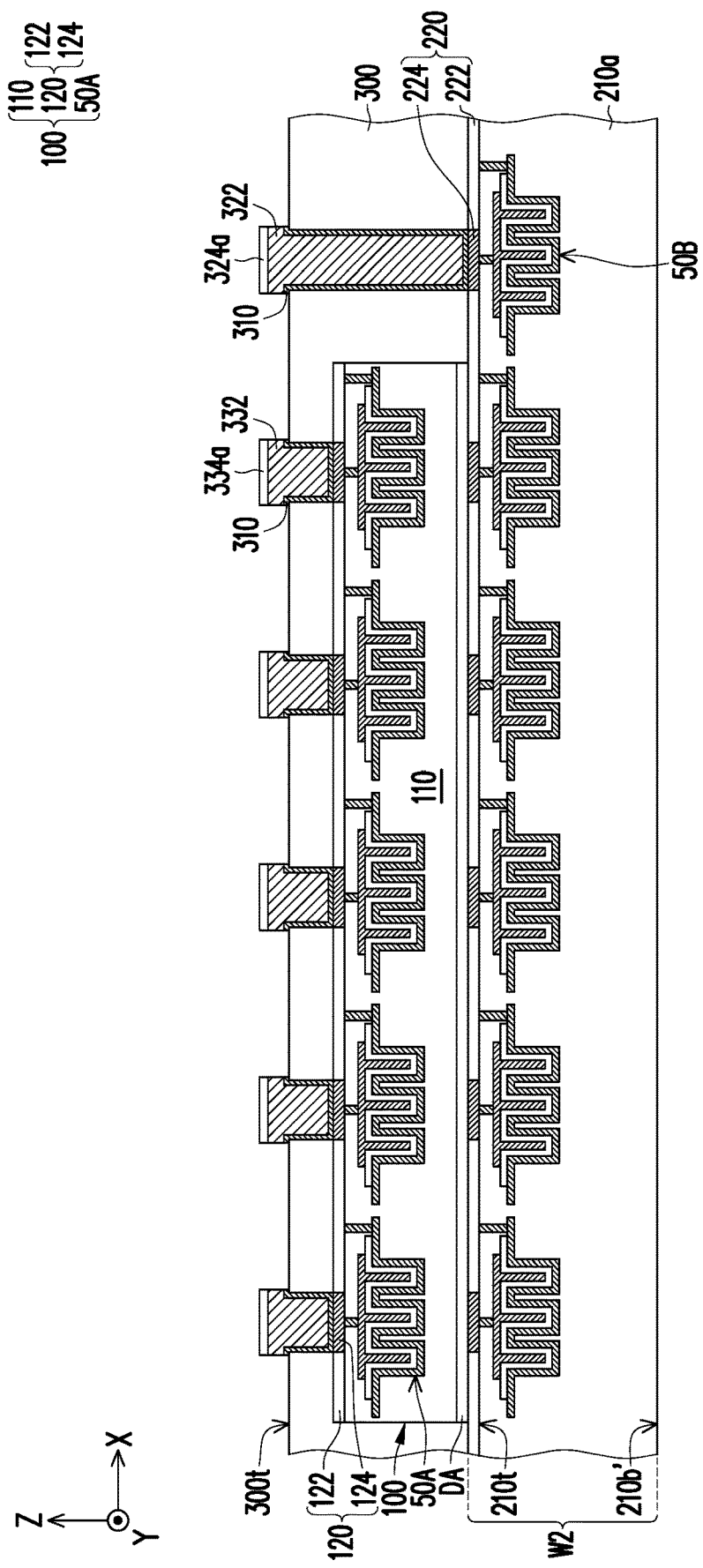

Referring to FIG. 13 and FIG. 14, in some embodiments, the seed layer material 310a is patterned to form a seed layer 310 between the metallization patterns 124 and the conductive vias 332 and between the metallization pattern 224 and the conductive via 322. The seed layer 310 is also referred to as a metallic seed layer. In some embodiments, portions of the seed layer material 310a not covered by the conductive vias 332 and the conductive via 322 are removed to form the seed layer 310. In other words, the seed layer 310 share the same geometrical shape with either the conductive vias 332 or the conductive via 322 located overlying thereto, on the top view (e.g. on the X-Y plane). As shown in FIG. 14, for example, a top surface 300t of the dielectric layer 300 are exposed by the seed layer 310, the conductive via 322 and the conductive vias 332.

In some embodiments, the patterning process may be performed by etching, where the seed layer material 310a is etched to form the seed layers 310 by using the conductive vias 322 and 332 as an etching mask. For example, the etching process may include a dry etching process or a wet etching process. As shown in FIG. 14, the seed layer 310 includes one or more conductive segments which are physically and electrically isolated from one another, for example. In certain embodiments, some of the conductive segments of the seed layer 310 are physically and electrically connected to one respective overlying conductive via 332 and one respective underlying metallization pattern 124, and the rest of the conductive segments of the seed layer 310 are physically and electrically connected to one respective overlying conductive via 322 and one respective underlying metallization pattern 224. In other words, the seed layer 310 may make electrical connections between the conductive via 332 and the semiconductor component 100 and make electrical connections between the conductive vias 322 and the semiconductor wafer W2. As shown in FIG. 14, for example, a sidewall of one conductive segment included in the seed layer 310 is substantially aligned with a sidewall of the respective conductive via 332 electrically connected thereto, and a sidewall of one conductive segment included in the seed layer 310 is substantially aligned with a sidewall of the respective conductive via 322 electrically connected thereto.

Figure 15:
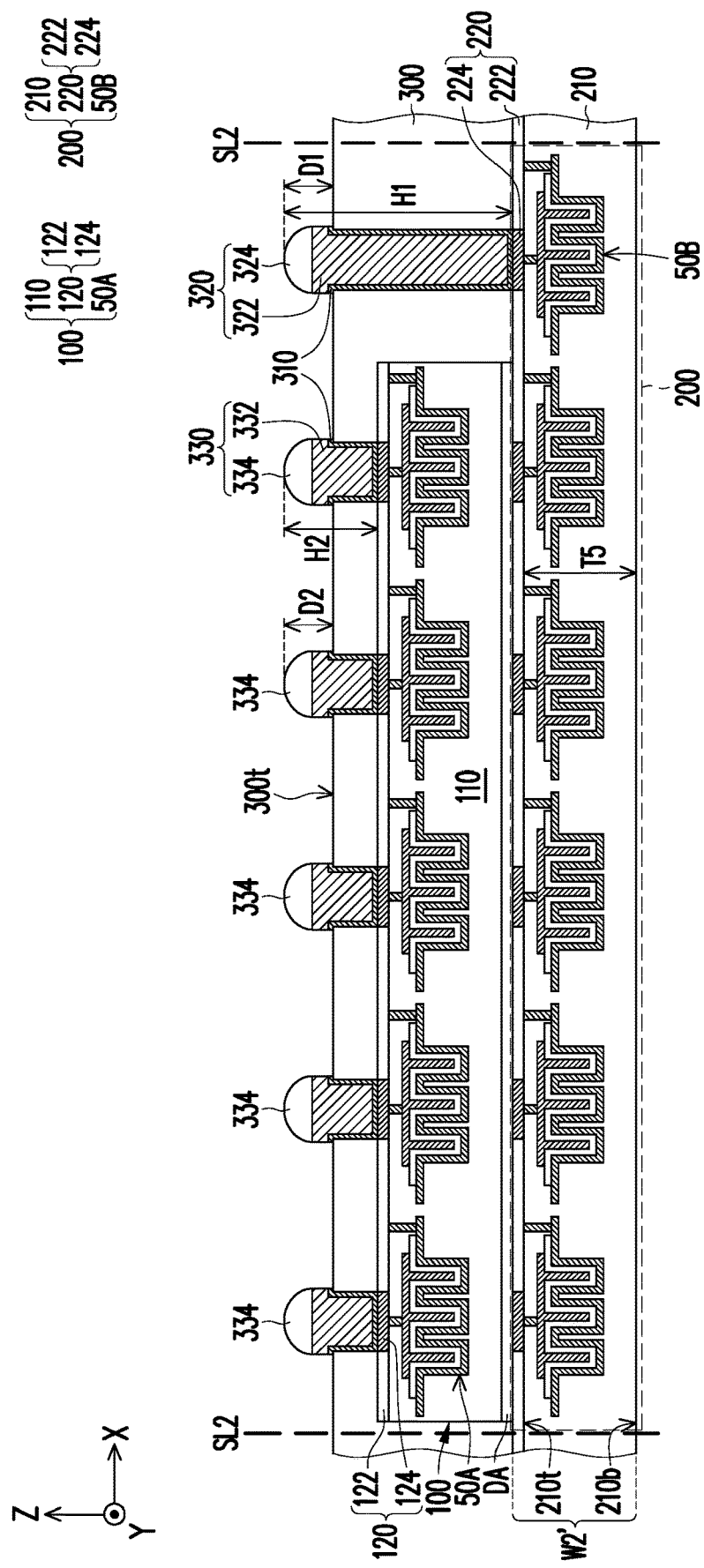

Referring to FIG. 15, in some embodiments, after the seed layer 310 is formed, a reflow process is performed on the solder material patterns 324a and 334a to form solder layers 324 and 334 respectively sited and capping on illustrated top surfaces of the conductive vias 322 and 332. During the reflow, the solder material patterns 324a and 334a may be shaped into the desired shapes, such as a dome-shape; however, the disclosure is not limited thereto. One conductive via 322 and one solder layer 324 located thereon and electrically connected thereto are together considered a conductive terminal 320, and one conductive via 332 and one solder layer 334 located thereon and electrically connected thereto are together considered a conductive terminal 330.

In some embodiments, each conductive terminal 320 is protruded out of the top surface 300t of the dielectric layer 300 by a distance D1, and each conductive terminal 330 is protruded out of the top surface 300t of the dielectric layer 300 by a distance D2. For example, the distance D1 is approximately ranging from 30 μm to 40 μm. For example, the distance D2 is approximately ranging from 30 μm to 40 μm. In some embodiments, the distance D1 and the distance D2 are substantially the same, where even if considering a height difference exists therebetween, the height difference is in an acceptable tolerance and thus is negligible. As shown in FIG. 15, for example, a height H1 of the conductive terminal 320 is greater than a height H2 of the conductive terminals 330. In some embodiments, the height H1 of the conductive terminal 320 is greater than a sum of a height of the first semiconductor component 100 and the height H2 of the conductive terminals 330.

Continued on FIG. 15, in some embodiments, after reflowing, a planarizing step is performed on the backside surface 210b' of the semiconductor substrate 210a to form semiconductor substrate 210. In some embodiments, the semiconductor substrate 210 has thickness T5 approximately ranging from 30 µm to 60 µm along the direction Z. The semiconductor substrate 210 is also referred to as a thin semiconductor substrate or a planarized semiconductor substrate. In some embodiments, the planarizing step may include a grinding process, a CMP process, or a combination thereof. After the planarizing step, a cleaning step may be optionally performed, for example to clean and remove the residue generated from the planarizing step. However, the disclosure is not limited thereto, and the planarizing step may be performed through any other suitable method.

As shown in FIG. 15, for example, a semiconductor wafer W2' with a plurality of semiconductor components 200 interconnected to each other is obtained after the planarizing step. In some embodiments, as shown in FIG. 15, the semiconductor components 200 each includes the semiconductor substrate 210, the capacitors 50B embedded in the semiconductor substrate 210 and the interconnect structure 220 disposed on the semiconductor substrate 210 and electrically connected to the capacitors 50B. The detail and materials of the components of the semiconductor components 200 are similar to the detail and materials of the components of the semiconductor components 100 as described in FIG. 1 through FIG. 4, and thus not repeated herein for simplicity. In the disclosure, the semiconductor components 200 may be referred to as a semiconductor integrated device, such as an integrated passive device. For example, only six capacitors 50B included in one semiconductor component 200 is shown in FIG. 15 for illustrative purposes; the disclosure is not limited thereto. The number of the capacitors 50B included in one semiconductor component 200 may be one or more than one, and may be selected and designated based one the demand and design layout.

In certain embodiments, to facilitate the planarizing step depicted in FIG. 15, the conductive terminals 320 and 330 are temporarily secured with a holding device (not shown) by placing the conductive terminals 320 and 330 onto the holding device, where the bottom surface 210b' of the semiconductor substrate 210a is facing away from the holding device for planarizing. For example, the holding device may be an adhesive tape, an adhesive carrier or a suction pad. However, the disclosure is not limited thereto.

Figure 16:
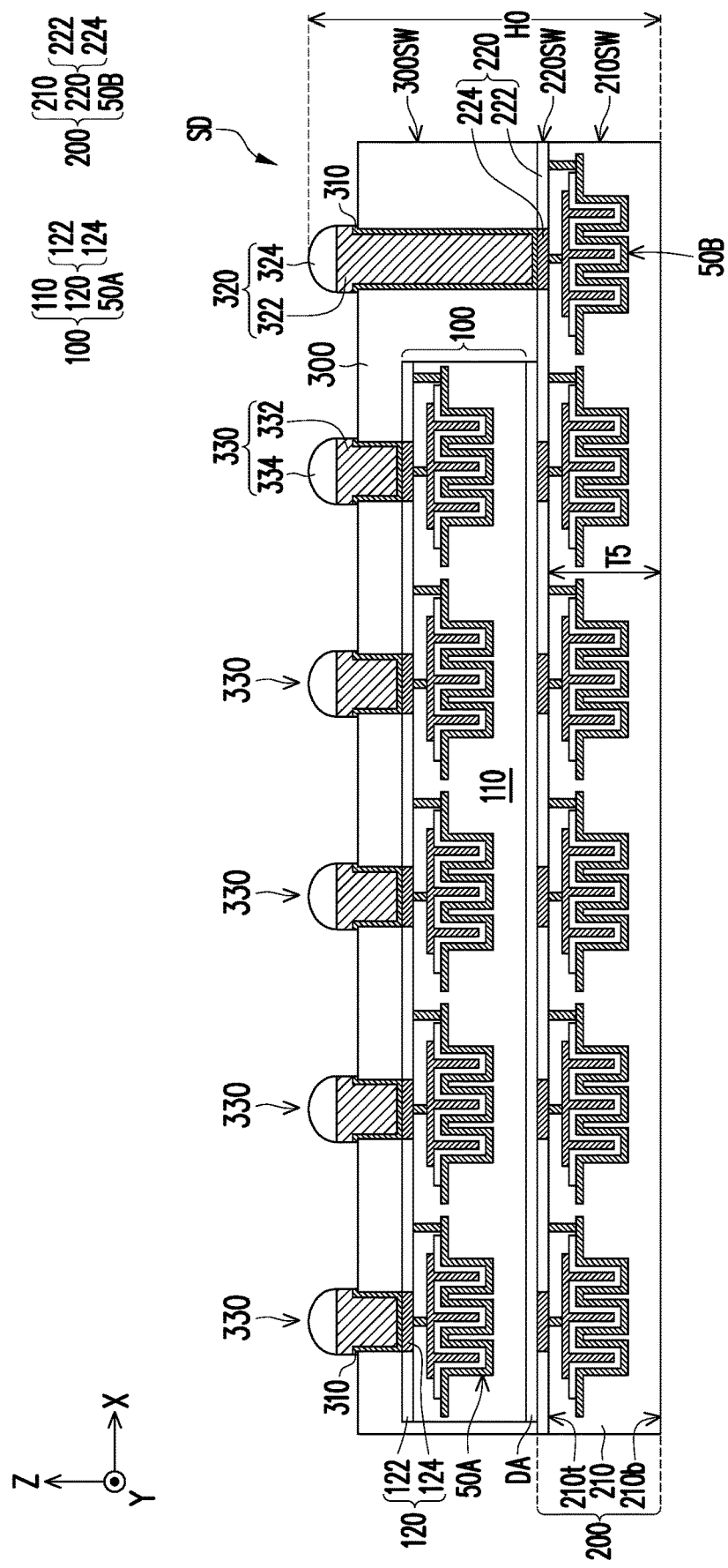

Referring to FIG. 15 and FIG. 16, in some embodiments, a dicing process (e.g., singulation) is performed along scribe lines SL2 to cut through the semiconductor wafer W2' and the dielectric layer 300, thereby forming individual and separate semiconductor devices SD. The dicing process may be a wafer dicing process including mechanical blade sawing or laser cutting, however the disclosure is not limited thereto. Up to here, the semiconductor devices SD are manufactured. In the disclosure, the semiconductor devices SD may be referred to as a semiconductor integrated device with a stacked structure, such as a stacked integrated passive device. For simplicity, only one semiconductor device SD is shown in FIG. 16 for illustrative purposes. As shown in FIG. 16, in the semiconductor device SD, a sidewall 300sw of the dielectric layer 300 is substantially aligned with a sidewall 220sw of the interconnect structure 220 and a sidewall 210sw of the semiconductor substrate 210 included in the second component 200, for example. In some embodiments, a height H0 of the semiconductor devices SD approximately ranges from 100 µm to 120 µm.

In some embodiments, the semiconductor device SD includes a stacked structure having one semiconductor component 100 stacked on one semiconductor component 200, the dielectric layer 300 located on the stacked structure and conductive terminals 320, 330 penetrating through the dielectric layer 300 and electrically coupled to the semiconductor component 100 (e.g., the capacitors 50A) and the semiconductor component 200 (e.g., the capacitors 50B) included in the stacked structure. In the disclosure, the semiconductor component 200 may be referred to as a first tier of the stacked structure, and the semiconductor component 100 may be referred to as a second tier of the stacked structure stacked on the first tier of the stacked structure, where the dielectric layer 300 may be referred to as a protection layer of the stacked structure for preventing from damages caused by transport and/or installation of the semiconductor device SD, and the conductive terminals 320, 330 are conductive terminals of the stacked structure for electrical connection to external components/elements. In detail, the conductive terminal 320 may be referred to as a conductive terminal of the semiconductor component 200, and the conductive terminals 330 may be referred to as conductive terminals of the semiconductor component 100. For example, the semiconductor component 100 is electrically isolated from the semiconductor component 200 in the semiconductor device SD, as shown in FIG. 16. Due to the stacked structure including the semiconductor component 100 and the semiconductor component 200, the capacitance of the semiconductor device SD is greatly increased (e.g. by 50% more) without increasing an occupying (horizontal) area. Owing to the stacked structure of the semiconductor device SD, a semiconductor package installed with the semiconductor device SD can achieve a better power integrity and system performance without scarifying the counts of conductive connectors, thereby improving power delivery for the semiconductor package. Examples of a semiconductor package will be provided will be described in detail later in accompanying with FIG. 21 through FIG. 23.

Figure 17:
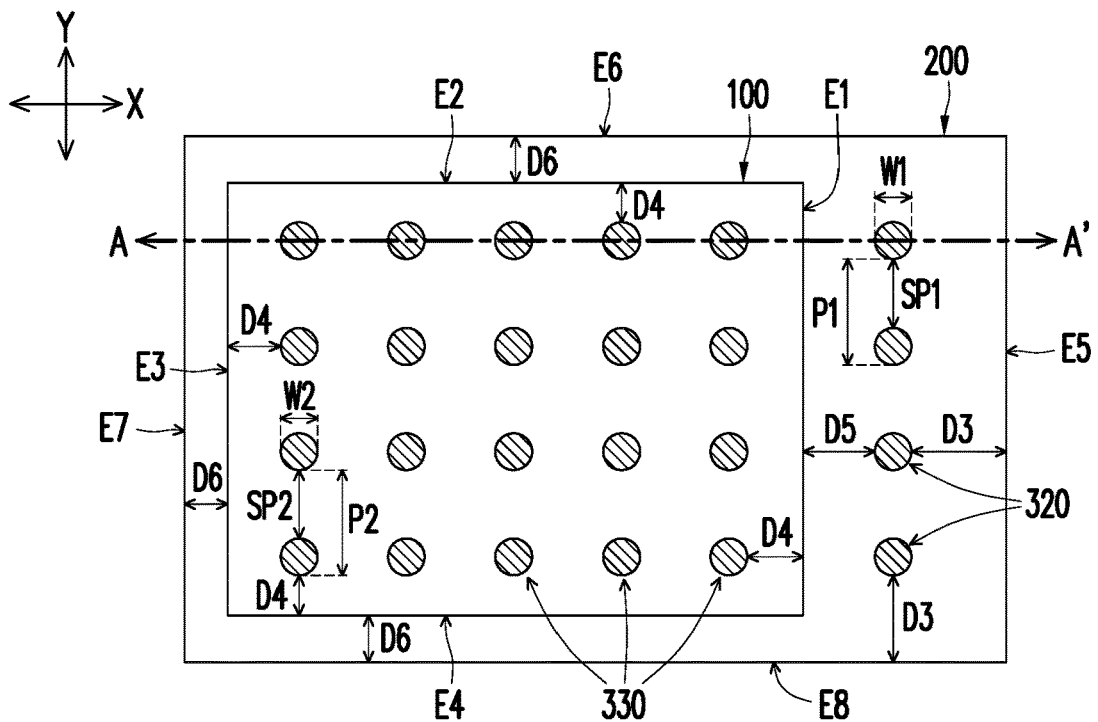
FIG. 17 to FIG. 20 are schematic top views respectively illustrating a relative position between semiconductor components of a semiconductor device in accordance with some embodiments of the disclosure.

In some embodiments, as shown in FIG. 16 and FIG. 17, a projection area of the semiconductor component 200 is greater than a projection area of the semiconductor component 100 on the X-Y plane along the direction Z. In other words, for the stacked structure of the semiconductor device SD of the disclosure, a projection area (e.g., a horizontal size on the X-Y plane) of a semiconductor component (e.g. 100) included in a upper tier is less than a projection area (e.g., a horizontal size on the X-Y plane) of a semiconductor component (e.g. 200) included in a tier underlying the upper tier along the stacking direction. FIG. 17 is a top view of the semiconductor device SD depicted in FIG. 16 only showing the semiconductor components 100, 200 and the conductive terminals 320, 330, where FIG. 16 is the cross-sectional view taken along a line AA' depicted in FIG. 17. Although only one semiconductor component 200 is shown to be included in the first tier and only one semiconductor component 100 is shown to be included in the second tier for illustrative purposes, it is appreciated that the number of the semiconductor component 200 included in the first tier and the number of the semiconductor component 100 included in the second tier independently may be one or more than one.

In an alternative embodiment, the first tier includes a plurality of semiconductor components 200, and the second tier includes one semiconductor component 100. In a further alternative embodiment, the first tier includes a plurality of semiconductor components 200, and the second tier includes a plurality of semiconductor components 100. In a yet further alternative embodiment, the first tier includes one semiconductor component 200, and the second tier includes a plurality of semiconductor components 100. In the embodiment of which the plurality of semiconductor components 100 and the plurality of semiconductor components 200 are included, the number of the semiconductor components 100 may be greater than, substantially equal to or less than the number of the semiconductor components 200, the disclosure is not limited thereto.

In other embodiments, the number of the tiers included in each stacked structure can be more than two, such as three, fourth, five, or so on based on the demand and design layout. In such embodiments of which the number of the number of the tiers included in one stacked structure is greater than two, a semiconductor component has a projection area less than a projection area of a semiconductor component located underlying thereto on a plane perpendicular to a stacking direction of the tiers in the stacked structure. Furthermore, in the embodiments of which a plurality of semiconductor dies are included in one tier of the stacked structure, projection areas of the semiconductor dies on a plane perpendicular to a stacking direction of the tiers in the stacked structure are the same. However, the disclosure is not limited thereto; alternatively, in the embodiments of which a plurality of semiconductor dies are included in one tier of the stacked structure, the projection areas of the semiconductor dies on the plane perpendicular to the stacking direction of the tiers in the stacked structure are different from one another, in part or all.

In some embodiments, the semiconductor component 100 and the semiconductor component 200 share the same geometry. For example, as shown in FIG. 17 through FIG. 20, the semiconductor component 100 and the semiconductor component 200 each have a rectangular shape, where the semiconductor component 100 has edges E1 to E4 while the semiconductor component 200 has edges E5 to E8, and the edges E1 to E4 respectively correspond to (e.g., positioning adjacent to each other, but not intersected and/or overlapped thereto) the edges E5 to E8. However, the disclosure is not limited thereto; alternatively, the shapes of the semiconductor component 100 and the semiconductor component 200 on the top view may be square or the like. In the disclosure, the sidewall of the semiconductor component 100 includes the edges E1 through the edges E4, and the sidewall of the semiconductor component 200 includes the edges E5 through the edges E8. In the disclosure, the conductive terminals 320 may be positioned next to the semiconductor component 100 by surrounding at least one side (e.g. one edge) of the semiconductor component 100, which will be described in conjunction with FIG. 17 through FIG. 20 below.

In some embodiments, as shown in FIG. 17, the conductive terminals 320 positioned on and electrically connected to the semiconductor component 200 are located at one side (e.g. the edge E1) of the semiconductor component 100 positioned on and electrically isolated from the semiconductor component 200. That is, the conductive terminals 320 may be presented between the edge E1 of the semiconductor component 100 and the edge E5 of the semiconductor component 100. In other words, for example, there is no conductive terminal 320 presented between other edges (e.g. E2 to E4) of the semiconductor component 100 and other edges (e.g. E6 to E8) of the semiconductor component 200, where the edge E2 to the edge E4 are respectively distant from edge E6 to the edge E8 by a distance D6. The distance D6 may be approximately from 200 μm to 500 μm. However, the disclosure is not limited thereto; alternatively, the conductive terminals 320 positioned on and electrically connected to the semiconductor component 200 may located at another edge (e.g., E2, E3 or E4) of the semiconductor component 100 positioned on and electrically isolated from the semiconductor component 200.

Figure 18:
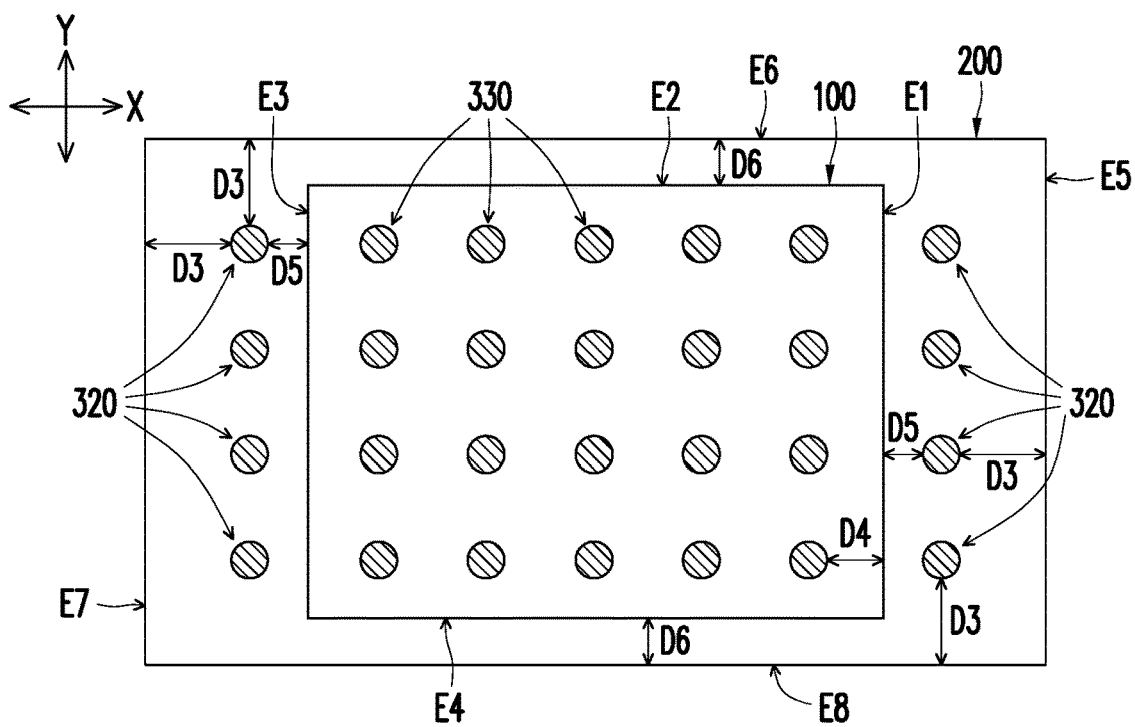

In an alternative embodiment, the conductive terminals 320 are located on the semiconductor component 200 along two sides (or saying edges) of the semiconductor component 100. The two sides of the semiconductor component 100 may include two opposite edges (such as the edges E1 and E3 or the edges E2 and E4) or two connected edges (such as the edges E1 and E2, the edges E2 and E3, the edges E3 and E4, or the edges E1 and E4), as viewed from a top-down view (e.g. the X-Y plane). In some embodiments of which involves two opposite edges as shown in FIG. 18, some of the conductive terminals 320 are presented between the edge E1 of the semiconductor component 100 and the edge E5 of the semiconductor component 200 and some of the conductive terminals 320 are presented between the edge E3 of the semiconductor component 100 and the edge E7 of the semiconductor component 200. That is, the conductive terminals 320 may surround (e.g. may be arranged next to) two sides of the semiconductor component 100.

Figure 19:
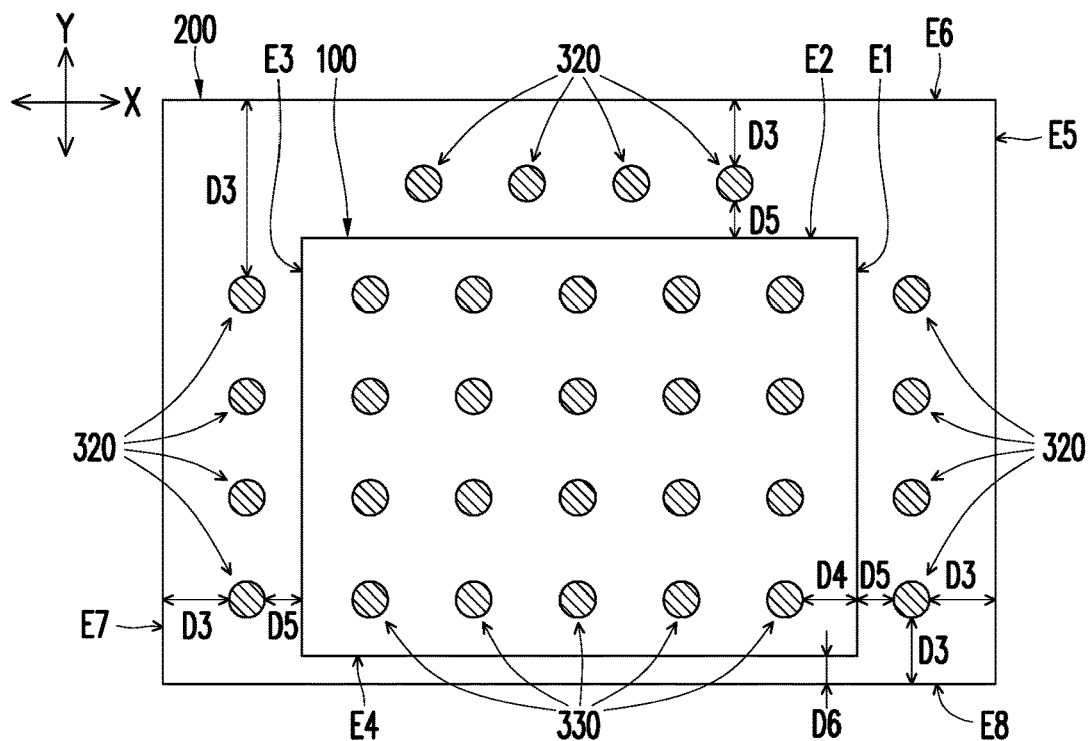

In a further alternative embodiment, the conductive terminals 320 are located on the semiconductor component 200 along three sides (or saying edges) of the semiconductor component 100. The three sides of the semiconductor component 100 may include three connected edges (such as the edges E1, E2 and E3 the edges E2, E3 and E4, or the edges E3, E4 and E1), as viewed from the top-down view. For example, as shown in FIG. 19, some of the conductive terminals 320 are presented between the edge E1 of the semiconductor component 100 and the edge E5 of the semiconductor component 300, some of the conductive terminals 320 are presented between the edge E2 of the semiconductor component 100 and the edge E6 of the semiconductor component 200, and some of the conductive terminals 320 are presented between the edge E3 of the semiconductor component 100 and the edge E7 of the semiconductor component 200. That is, the conductive terminals 320 may surround (e.g. may be arranged next to) three sides of the semiconductor component 100.

Figure 20:
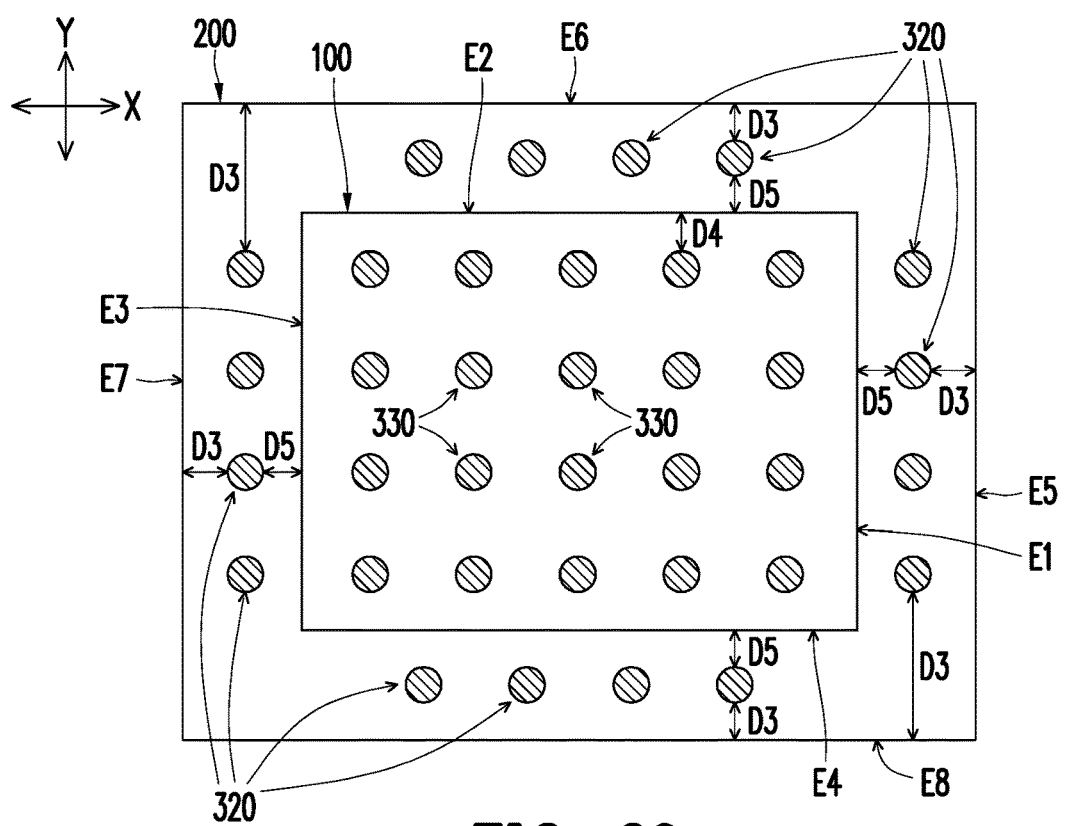

In a yet further alternative embodiment, the conductive terminals 320 are located on the semiconductor component 200 along all sides (or saying edges) of the semiconductor component 100. The all sides of the semiconductor component 100 may referred to as a periphery of the semiconductor component 100, as viewed from the top-down view. For example, as shown in FIG. 20, some of the conductive terminals 320 are presented between the edge E1 of the semiconductor component 100 and the edge E5 of the semiconductor component 300, some of the conductive terminals 320 are presented between the edge E2 of the semiconductor component 100 and the edge E6 of the semiconductor component 200, some of the conductive terminals 320 are presented between the edge E3 of the semiconductor component 100 and the edge E7 of the semiconductor component 200, and some of the conductive terminals 320 are presented between the edge E4 of the semiconductor component 100 and the edge E8 of the semiconductor component 200. That is, the conductive terminals 320 may surround the periphery of the semiconductor component 100.

Back to FIG. 17, in some embodiments, along the X-Y plane, the conductive terminals 320 are arranged in a matrix form on the semiconductor component 200, such as the N×N array or N×M arrays (N, M>0, N may or may not be equal to M). The size of the array for the conductive terminals 320 can be designated and selected based on the demand, and is not limited to the disclosure. For example, as shown in FIG. 17, the conductive terminals 320 are arranged into a column (e.g. a 1×4 array) on the X-Y plane. However, the disclosure is not limited thereto, in an alternative embodiment, the conductive terminals 320 are randomly arranged over the semiconductor component 200. In some embodiments, on the X-Y plane, a maximum width W1 of each of the conductive terminals 320 approximately ranges from 30 μm to 50 μm, a pitch P1 of the conductive terminals 320 approximately ranges from 70 μm to 100 μm, and a spacing distance SP1 between any two immediately adjacent conductive terminals 320 approximately ranges from 40 μm to 50 μm. In some embodiments, the conductive terminals 320 located nearest to an edge of the semiconductor component 200 is distant from the edge by a distance D3 approximately ranging from 100 μm to 200 μm. In some embodiments, the conductive terminals 320 located nearest to an edge of the semiconductor component 100 is distant from the edge by a distance D5 approximately ranging from 200 μm to 500 μm.

In some embodiments, along the X-Y plane, the conductive terminals 330 are arranged in a matrix form on the semiconductor component 100, such as the N'×N' array or N'×M' arrays (N', M'>0, N' may or may not be equal to M'). The size of the array for the conductive terminals 330 can be designated and selected based on the demand, and is not limited to the disclosure. For example, as shown in FIG. 17, the conductive terminals 330 are arranged into a 5×4 array on the X-Y plane. However, the disclosure is not limited thereto, in an alternative embodiment, the conductive terminals 330 are randomly arranged over the semiconductor component 100. In some embodiments, on the X-Y plane, a maximum width W2 of each of the conductive terminals 330 approximately ranges from 30 μm to 50 μm, a pitch P2 of the conductive terminals 330 approximately ranges from 70 μm to 100 μm, and a spacing distance SP2 between any two immediately adjacent conductive terminals 320 approximately ranges from 40 μm to 50 μm. In some embodiments, the conductive terminals 330 located nearest to an edge of the semiconductor component 100 is distant from the edge by a distance D4 approximately ranging from 100 μm to 200 μm.

For example, a shape of the conductive terminals 320 and a shape of the conductive terminals 330 may have a substantially circular shape (for top view depicted in FIG. 17), however the disclosure is not limited thereto. In other embodiments, the shape of the conductive terminals 320 and the shape of the conductive terminals 330 may independently be ellipse, oral, square, rectangular or any suitable polygonal shape.

In the disclosure, the semiconductor device SD may be implanted to (e.g. bonded to) a (semiconductor) package structure such as an integrated fan-out (InFO) package or a (semiconductor) package structure with a stacked structure such as a flip-chip package or a chip-on-wafer-on-substrate (CoWoS) package. In one embodiment, the semiconductor device SD is bonded to one InFO package by connecting the conductive terminals 320 and 330 to a redistribution circuit structure/layer of the InFO package. In an alternative embodiment, the semiconductor device SD is bonded to one CoWoS package or one flip-chip package by connecting the conductive terminals 320 and 330 to a circuit substrate of the CoWoS package or the flip-chip package.

Figure 21:
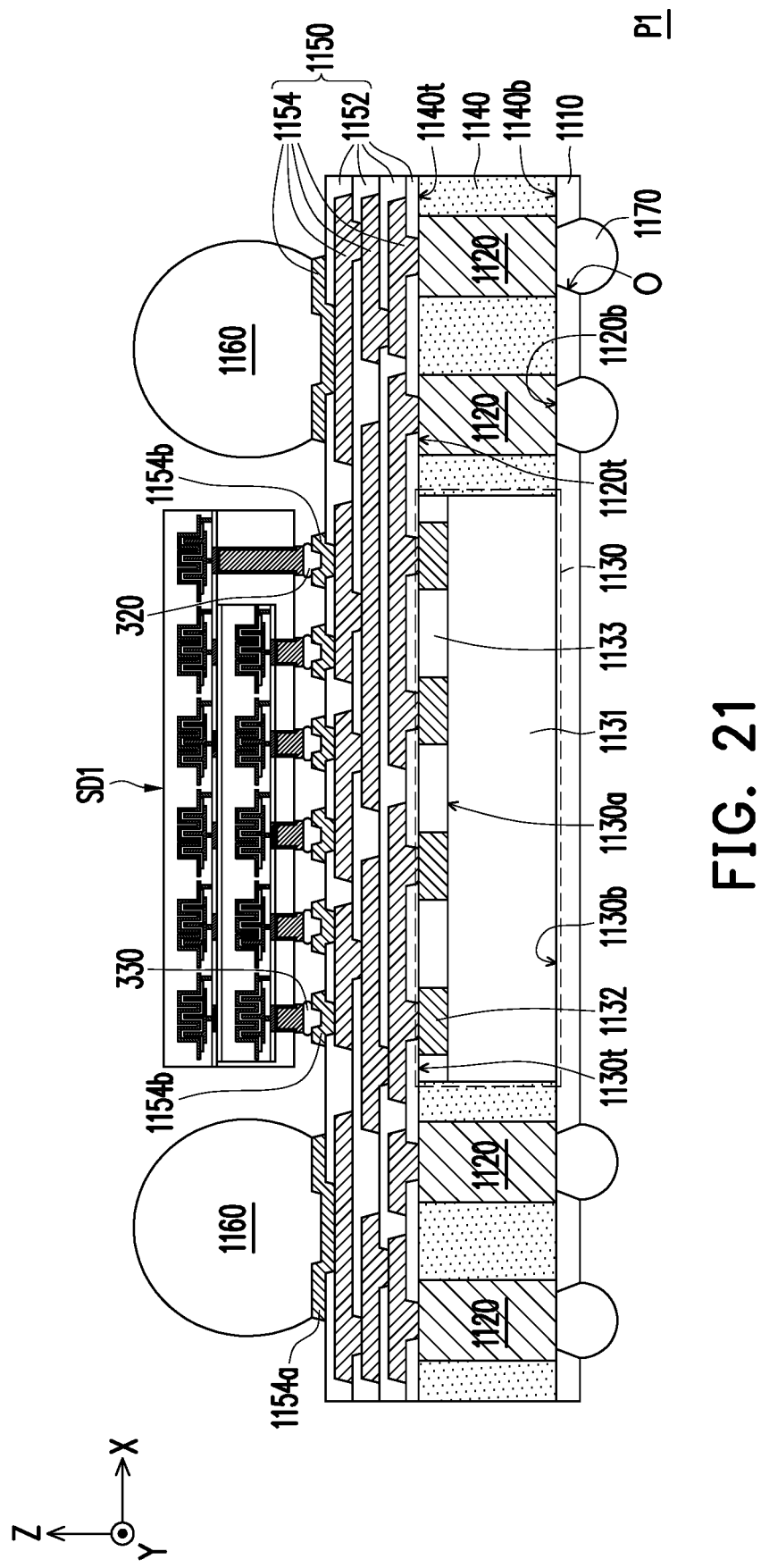
FIG. 21 is a schematic cross-sectional view of a package structure including a semiconductor device in accordance with some embodiments of the disclosure.

FIG. 21 is a schematic cross-sectional view of a package structure including a semiconductor device in accordance with some embodiments of the disclosure. Referring to FIG. 21, in some embodiments, a (semiconductor) package structure P1 is provided, where the package structure P1 includes a semiconductor die 1130, an insulating encapsulation 1140 partially encapsulating the semiconductor die 1130, a redistribution circuit structure 1150 located on the insulating encapsulation 1140 and electrically connected to the semiconductor die 1130, conductive terminals 1160 located on the redistribution circuit structure 1150, and at least one semiconductor device SD1 located on the redistribution circuit structure 1150. In certain embodiments, the package structure P1 further includes the dielectric layer 1110, conductive pillars 1120, and the conductive terminals 1170. For example, only four conductive pillars 1120, one semiconductor die 1130, two conductive terminals 1160, fourth conductive terminals 1170, and one semiconductor device SD1 are depicted in FIG. 21 for illustrative purposes, however the disclosure is not limited thereto. The number of each of the conductive pillars 1120, the semiconductor die 1130, conductive terminals 1160, the conductive terminals 1170, and the semiconductor device SD1 may be one or more than one, and may be selected and designated based on the demand and/or the design layout. Owing to the conductive terminals 1160 and 1170, the package structure P1 may be referred to as an InFO package with dual-sides terminals.

In some embodiments, the conductive pillars 1120 and the semiconductor die 1130 are located on the dielectric layer 1110 along the direction Z, and the conductive pillars 1120 are arranged aside of the semiconductor die 1130 on the X-Y plane (e.g. along the direction X and/or the direction Y). For example, a material of the dielectric layer 1110 may be a polymer-based dielectric material (such as PBO, BCB, PI or the like), an inorganic material (such as silicon oxide, silicon nitride, silicon oxynitride or the like), or any suitable dielectric material.

In some embodiments, the semiconductor die 1130 includes a semiconductor substrate 1131 having an active surface 1130a and a backside surface 1130b opposite to the active surface 1130a, a plurality of conductive vias 1132 distributed on the active surface 1130a, and a protection layer 1133 disposed on the active surface 1130a and at least partially covering sidewalls of the conductive vias 1132, where the conductive vias 1132 serve as conductive terminals of the semiconductor die 1130 for electrical connection to other devices/elements (e.g., the redistribution circuit structure 1150). In some embodiments, the conductive vias 1132 are copper pillars, copper alloy pillar or other suitable metal pillars, for example. In some embodiments, the protection layer 1133 may be a PBO layer, a PI layer or other suitable polymers. In some alternative embodiments, the protection layer 1133 may be made of inorganic materials, such as silicon oxide, silicon nitride, silicon oxynitride, or any suitable dielectric material. In an alternative embodiment, the protection layer 1133 may be omitted from the semiconductor die 1130.

A material of the semiconductor substrate 1131 may include a silicon substrate including active devices (e.g., transistors and/or memories such as N-type metal-oxide semiconductor (NMOS) and/or P-type metal-oxide semiconductor (PMOS) devices, or the like) and/or passive devices (e.g., resistors, capacitors, inductors or the like)

formed therein. In some embodiments, such active devices and passive devices may be formed in a front-end-of-line (FEOL) process. In an alternative embodiment, the semiconductor substrate 1131 may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 1131 may further include an interconnection structure (not shown) disposed on the active surface 1130a. In certain embodiments, the interconnection structure may include one or more inter-dielectric layers and one or more patterned conductive layers stacked alternately for providing routing function to the active devices and the passive devices embedded in the semiconductor substrate 1131, where the conductive vias 1132 may be referred to as an outermost layer of the patterned conductive layers or electrically connected to an outermost layer of the patterned conductive layers. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition.

The semiconductor die 1130 described herein may be referred to as a semiconductor chip or an integrated circuit (IC). For example, the semiconductor die 1130 is a logic chip, such as a central processing unit (CPU), graphics processing unit (GPU), system-on-chip (SoC), system-on-integrated-circuit (SoIC), microcontroller, or the like. However, the disclosure is not limited thereto; in alternative embodiments, the semiconductor die 1130 is a digital chip, analog chip or mixed signal chip, such as an application-specific integrated circuit ("ASIC") chip, a sensor chips, a wireless and radio frequency (RF) chip, a baseband (BB) chip, a memory chip (such as high bandwidth memory (HBM) dies) or a voltage regulator chip. In further alternative embodiments, the semiconductor die 1130 is referred to as a chip or an IC of combination-type, such as a WiFi chip simultaneously including both of a RF chip and a digital chip. In alternative embodiments of which a plurality of the semiconductor dies 1130 are included, a type of a first group of the semiconductor dies 1130 are different from a type of a second group of the semiconductor dies 1130.

For example, the conductive pillars 1120 are referred to as through integrated fan-out (InFO) vias. In some embodiments, the conductive pillars 1120 are formed over the dielectric layer 1110 by photolithography, plating, and photoresist stripping process. In some alternative embodiments, the conductive pillars 1120 are pre-fabricated through other processes and are mounted over the dielectric layer 1110. For example, the conductive pillars 1120 include copper posts or other metallic posts.

In some embodiments, the conductive pillars 1120 and the semiconductor die 1130 are partially encapsulated in the insulating encapsulation 1140, where top surfaces 1120t of the conductive pillars 1120 and a top surface 1130t of the semiconductor die 1130 are substantially coplanar to and levelled with a top surface 1140t of the insulating encapsulation 1140, and bottom surfaces 1120b of the conductive pillars 1120 and a bottom surface 1130b of the semiconductor die 1130 are substantially coplanar to and levelled with a bottom surface 1140b of the insulating encapsulation 1140. In other words, the conductive pillars 1120 and the semiconductor die 1130 are laterally encapsulated in the insulating encapsulation 1140, and only sidewalls of the conductive pillars 1120 and the semiconductor die 1130 are covered by the insulating encapsulation 1140.

The insulating encapsulation 1140 may include an acceptable insulating encapsulation material. The insulating encapsulation 1140, for example, includes polymers (such as epoxy resins, phenolic resins, silicon-containing resins, or other suitable resins), dielectric materials, or other suitable materials. The insulating encapsulation 1140 may be a molding compound formed by a molding process. The insulating encapsulation 1140 may further include inorganic filler or inorganic compound (e.g. silica, clay, and so on) which can be added therein to optimize coefficient of thermal expansion (CTE) of the insulating encapsulation 1140. The disclosure is not limited thereto.

Continued on FIG. 21, in some embodiments, the redistribution circuit structure 1150 is disposed on the insulating encapsulation 1140 and is electrically connected to the conductive pillars 120 and the semiconductor die 1130, where the redistribution circuit structure 1150 provides routing function for the semiconductor die 1130. In some embodiments, the redistribution circuit structure 1150 includes a plurality of inter-dielectric layers 1152 and a plurality of redistribution conductive layers 1154 stacked alternately, and the redistribution conductive layers 1154 are electrically connected to the conductive vias 1132 of the semiconductor die 1130 and the conductive pillars 1120 encapsulated by the insulating encapsulation 1140. For example, the conductive vias 1132 of the semiconductor die 1130 and the conductive pillars 1120 are electrically connected to the bottommost one of the redistribution conductive layers 1154. In certain embodiments, the topmost redistribution conductive layer 1154 may include a plurality of pads. In such embodiments, the above-mentioned pads may include a plurality of under-ball metallurgy (UBM) patterns 1154a for ball mount (such as the conductive terminals 1160) and/or a plurality of connection pads 1154b for mounting of passive devices (such the semiconductor device SD1). The numbers of the UBM patterns 1154a and the number of the connection pads 1154b are not limited according to the disclosure. The numbers of the inter-dielectric layers 1152 and of the redistribution conductive layers 1154 are not limited according to the disclosure. The redistribution circuit structure 1150 may be referred to as a front-side redistribution layer of the semiconductor dies 1130 for providing routing function. However, the disclosure is not limited thereto; alternatively, an addition redistribution circuit structure may be formed between the dielectric layer 1110 and the semiconductor dies 1130 and between the dielectric layer 1110 and the conductive pillars 1120, where the addition redistribution circuit structure may be electrically connected to the semiconductor dies 1130 through the conductive pillars 1120 and the redistribution circuit structure 1150. In such alternative embodiment, the additional redistribution circuit structure may be referred to as a back-side redistribution layer of the semiconductor dies 1130 for providing routing function.

In some embodiments, the conductive terminals 1160 are disposed on the UBM 1154a by a suitable process such as evaporation, electroplating, ball drop, or screen printing. In some embodiments, the conductive terminals 1160 may be disposed on the UBM patterns 1154a by ball placement process or reflow process. In some embodiments, the semiconductor device SD1 is picked and placed over the redistribution circuit structure 1150, and is bonded to the redistribution circuit structure 1150 through connecting the conductive terminals 320, 330 of the semiconductor device SD1 to the connection pads 1154b. The detail of the semiconductor device SD1 is the same as the detail of the semiconductor device SD as described in FIG. 1 through FIG. 20, and thus are not repeated herein for simplicity. As shown in FIG. 21, an illustrated top surface of the semiconductor device SD1 is below illustrated top surfaces of the conductive terminals 1160, in some embodiments. In other words, the height of the semiconductor device SD1 is less than a height of the conductive terminals 1160 mounted to the redistribution circuit structure 1150.

In some embodiments, as illustrated in FIG. 21, the conductive terminals 1170 are electrically connected to the conductive pillars 1120 through a plurality of openings O formed in the dielectric layer 1110. For example, the openings O formed in the dielectric layer 1110 expose the bottom surfaces 1120b of the conductive pillars 1120, and the conductive terminals 1170 are connected to the conductive pillars 1120. The conductive terminals 1170 may be disposed on the UBM patterns 1154a by ball placement process or reflow process.

In some embodiments, the conductive terminals 1160 and the conductive terminals 1170, independently, are controlled collapse chip connection (C4) bumps (for example, which may have, but not limited to, a size of about 80 μm) or ball grid array (BGA) balls (for example, which may have, but not limited to, a size of about 400 μm). In alternative embodiments, the conductive terminals 1160 and the conductive terminals 1170, independently, are solder balls or ball girl array (BGA) balls. In further alternative embodiments, the conductive terminals 1160 and the conductive terminals 1170, independently, include micro-bumps (μ-bump), where the micro-bumps may be solder bumps, and/or includes metal pillars (e.g., copper pillars). The solder may include lead or be lead-free, and may include Sn—Ag, Sn—Cu, Sn—Ag—Cu, or the like. The conductive terminals 1160 and the conductive terminals 1170, one of which, may be referred to as conductive connectors for connecting with another package. Or alternatively, the conductive terminals 1160 and the conductive terminals 1170, one of which, may be referred to as conductive terminals for inputting/outputting electric and/or power signals.

For example, through the redistribution circuit structure 1150, the conductive terminals 1160, the semiconductors device SD1 and the conductive pillars 1120 are electrically connected to the semiconductor die 1130. For example, through the conductive pillars 1120 and the redistribution circuit structure 1150, the conductive terminals 1170 are electrically connected to the semiconductor die 1130. Owing to the semiconductors device SD1, the package structure P1 achieves a better power integrity and power density network without scarifying the counts of conductive connectors (e.g., the counts of the conductive terminals 1160), thereby improving power delivery and system performance for the package structure P1.

In certain embodiments, an additional package (not shown) may bonded to the package structure P1 through the conductive terminals 1170 to form a Package-on-Package (PoP) structure. The addition package may be a package including one or more than one memory die/chip or a package including one or more than one memory die/chip and one or more than one logic processing die/chip. In such embodiments, the one or more than one memory die/chip and/or the one memory die/chip and one or more than one logic processing die/chip included in the additional package is electrically connected and communicated with the semiconductor die 1130 included in the package structure P1.

Figure 22:
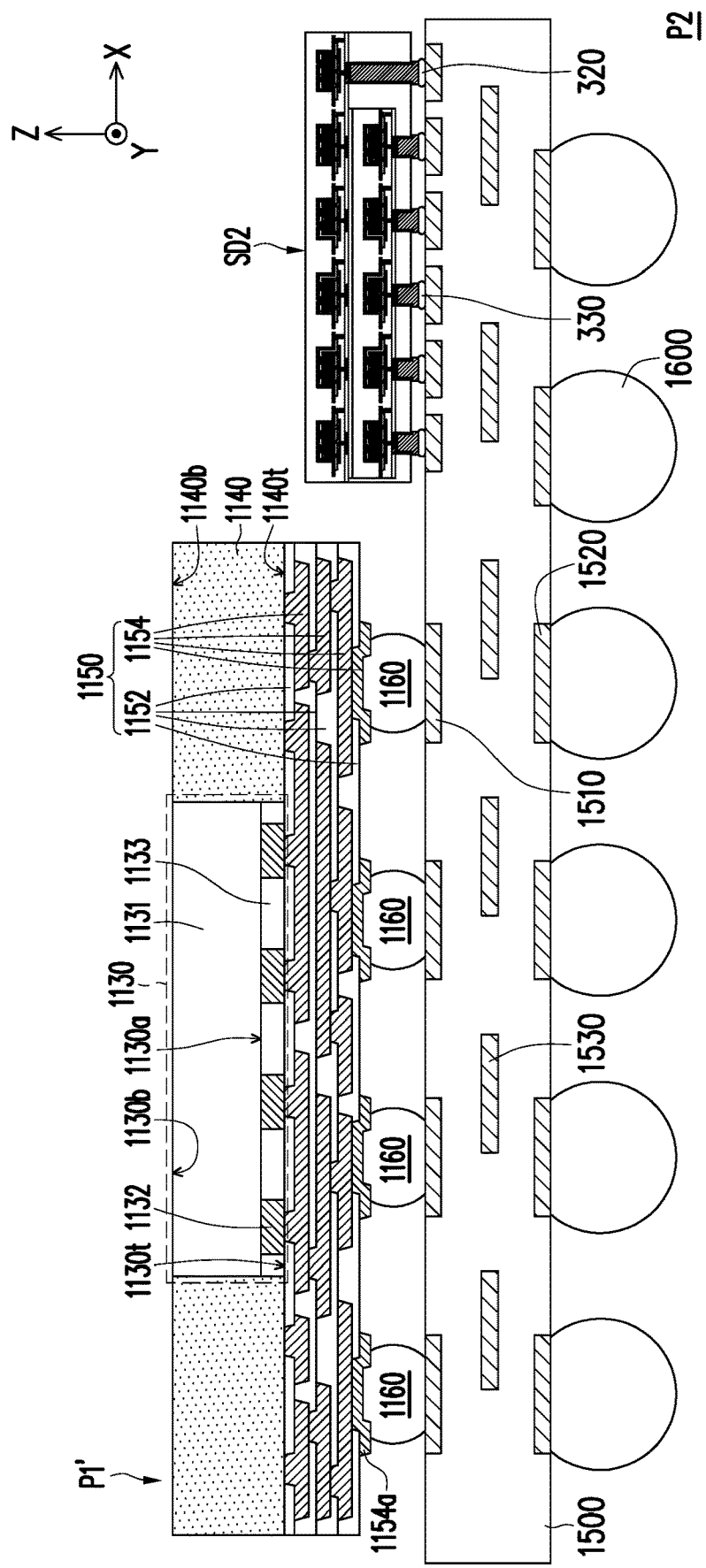
FIG. 22 is a schematic cross-sectional view of a package structure including a semiconductor device in accordance with some embodiments of the disclosure.

FIG. 22 is a schematic cross-sectional view of a package structure including a semiconductor device in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein for brevity. Referring to FIG. 22, in some embodiments, a substrate 1500 is provided, where a package structure P1' and a semiconductor device SD2 is bonded on the substrate 1500 to form the package structure P2 having a stacked structure.

In some embodiments, the substrate 1500 includes contact pads 1510, contact pads 1520, metallization layers 1530, and vias (not shown). In some embodiments, the contact pads 1510 and the contact pads 1520 are respectively distributed on two opposite sides of the substrate 1500 and are exposed for electrically connecting with later-formed elements/features. In some embodiments, the metallization layers 1530 and the vias are embedded in the substrate 1500 and together provide routing function for the substrate 1500, where the metallization layers 1530 and the vias are electrically connected to the contact pads 1510 and the contact pads 1520. That is, at least some of the contact pads 1510 are electrically connected to some of the contact pads 1520 through the metallization layers 1530 and the vias. In some embodiments, the contact pads 1510 and the contact pads 1520 may include metal pads or metal alloy pads. In some embodiments, the materials of the metallization layers 1530 and the vias may be substantially the same or similar to the material of the redistribution conductive layers 1154, and thus are not repeated herein.

In some embodiments, the package structure P1' is provided and mounted onto the substrate 1500. For example, the package structure P1' depicted in FIG. 22 is similar to the package structure P1 depicted in FIG. 21; the difference is that, the package structure P1' excludes the dielectric layer 1110, the conductive pillars 1120, the conductive terminals 1170 and the semiconductor device SD1. The detail of components of the package structure P1' can be found in FIG. 21, and thus are not repeated herein for simplicity. As shown in FIG. 22, for example, the package structure P1' is picked and placed over the substrate 1500, and is then bonded to the substrate 1500 through physically connecting the conductive terminals 1160 and the contact pads 1510. As shown in FIG. 22, for example, the package structure P1' is electrically connected to the substrate 1500. The package structure P1' may be bonded to the substrate 1500 through flip-chip bonding technology and/or surface mount technology.

In some embodiments, the semiconductor device SD2 is provided and mounted onto the substrate 1500. The detail of the semiconductor device SD2 is the same as the detail of the semiconductor device SD as described in FIG. 1 through FIG. 20, and thus are not repeated herein for simplicity. As shown in FIG. 22, for example, the semiconductor device SD2 is picked and placed over the substrate 1500, and is then bonded to the substrate 1500 through physically connecting the conductive terminals 320, 330 and the contact pads 1510. As shown in FIG. 22, for example, the semiconductor device SD2 is electrically connected to the substrate 1500. The package structure P1' may be bonded to the substrate 1500 through flip-chip bonding technology and/or surface mount technology. In some embodiments, the semiconductor device SD2 is electrically connected to the package structure P1 through the substrate 1500.

After mounting the package structure P1' and the semiconductor device SD2 on the substrate 1500, the package structure P2 having the stacked structure is manufactured. The package structure P2 may be referred to as a flip chip package. Owing to the semiconductors device SD2, the package structure P2 achieves a better power integrity and power density network without scarifying the counts of conductive connectors (e.g., the counts of the conductive terminals 1160 included in the package structure P1'), thereby improving power delivery and system performance for the package structure P1' included in the package structure P2. In some embodiments, the substrate 1500 is referred to as a circuit substrate, such as an organic flexible substrate or a printed circuit board. In such embodiments, the conductive terminals 1160 are, for example, chip connectors or BGA balls. In some embodiments, an optional underfill (not shown) may be applied to fill the gap between the package structure P1' and the substrate 1500 and/or the gap between the semiconductor device SD2 and the substrate 1500, which enhances the bonding strength therebetween. The reliability of the package structure P2 can be improved.

In some embodiments, a plurality of conductive terminals 1600 are optionally formed on the substrate 1500. As shown in FIG. 22, for example, the conductive terminals 1600 are connected to the contact pads 1520 of the substrate 1500. In other words, the conductive terminals 1600 are electrically connected to the substrate 1500 through the contact pads 1520. Through the contact pads 1510 and the contact pads 1520, some of the conductive terminals 1600 are electrically connected to the package structure P1' (e.g. the semiconductor die 1130 included therein). In some embodiments, the conductive terminals 1600 are, for example, solder balls or BGA balls. However, the disclosure is not limited thereto; in an alternative embodiment, the conductive terminals 1600 may be omitted.

Figure 23:
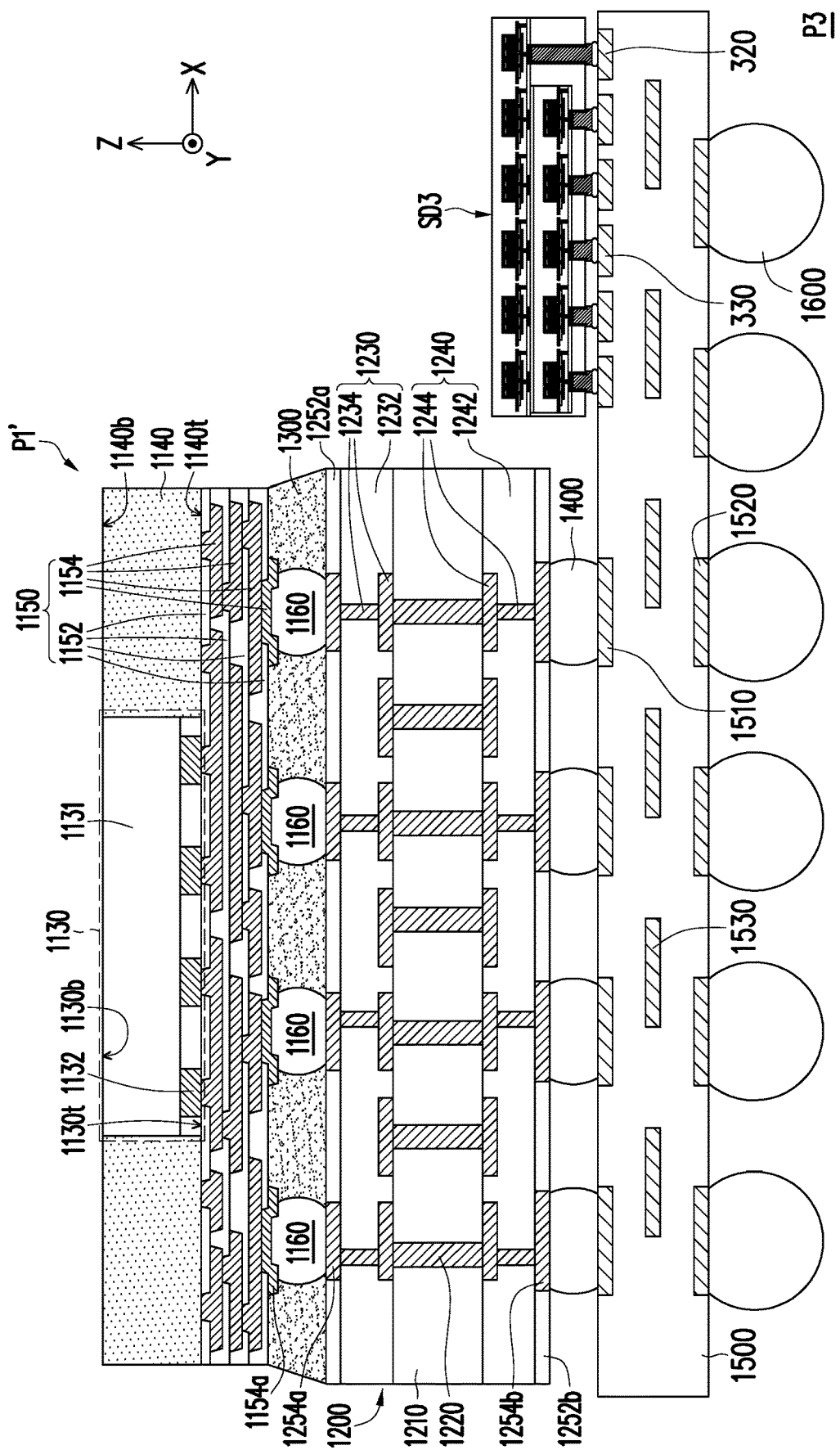
FIG. 23 is a schematic cross-sectional view of a package structure including a semiconductor device in accordance with some embodiments of the disclosure.

FIG. 23 is a schematic cross-sectional view of a package structure including a semiconductor device in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein for brevity. Referring to FIG. 23, in some embodiments, a circuit element 1200 is provided, where the package structure P1' depicted in FIG. 22 is bonded on the circuit element 1200, and the circuit element 1200 and a semiconductor device SD3 are mounted to the substrate 1500 to form a package structure P3 having a stacked structure. The detail of the semiconductor device SD3 is the same as the detail of the semiconductor device SD as described in FIG. 1 through FIG. 20, the detail of the package structure P1' can be found in FIG. 21 and FIG. 22, and the detail of the substrate 1500 has been described in FIG. 22, and thus are not repeated herein for brevity.

In some embodiments, the circuit element 1200 includes a core portion 1210, a plurality of vias 1220, a redistribution circuit structure 1230, a redistribution circuit structure 1240, a solder mask layer 1252a, a solder mask layer 1252b, a plurality of bonding pads 1254a, and a plurality of bonding pads 1254b. In some embodiments, the core portion 1210 may include a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. In some embodiments, the vias 1220 is through silicon vias penetrating the core portions 1210.

In some embodiments, the redistribution circuit structure 1230 and the redistribution circuit structure 1240 respectively disposed on two opposite sides of the core portion 1210, as shown in FIG. 23. The core portion 1210 embedded with the vias 1220 is located between and in contact with the redistribution circuit structure 1230 and the redistribution circuit structure 1240, in some embodiments. Through the vias 1220, the redistribution circuit structure 1230 and the redistribution circuit structure 1240 are electrically connected to each other. In some embodiments, the redistribution circuit structure 1230 includes sequentially forming one or more dielectric layers 1232 and one or more metallization layers 1234 in alternation, where one metallization layer 1234 is sandwiched between two dielectric layers 1232. In some embodiments, the redistribution circuit structure 1240 includes sequentially forming one or more dielectric layers 1242 and one or more metallization layers 1244 in alternation, where one metallization layer 1244 is sandwiched between two dielectric layers 1242. The numbers of the metallization layers and the dielectric layers included in each of the redistribution circuit structures 1230 and 1240 are not limited thereto, and may be independently designated and selected based on the demand. In an alternative embodiment, the redistribution circuit structure 1230 and the redistribution circuit structure 1240, one or both, may be omitted from the circuit element 1200, the disclosure is not limited thereto.

In certain embodiments, the materials of the dielectric layers 1232 and the dielectric layers 1242 may be PI, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 1232 and the dielectric layers 1242 formed by suitable fabrication techniques such as spin-on coating, chemical vapor deposition (CVD) (such as Plasma Enhanced Chemical Vapor Deposition (PECVD)), or the like. The disclosure is not limited thereto. In one embodiment, the materials of the dielectric layers 1232 and the dielectric layers 1242 may be the same. In an alternative embodiment, the materials of the dielectric layers 1232 and the dielectric layers 1242 may be different.

In certain embodiments, the material of the metallization layers 1234 and the metallization layers 1244 may be made of conductive materials formed by electroplating or deposition, such as aluminum, titanium, copper, nickel, tungsten, and/or alloys thereof, which may be patterned using a photolithography and etching process. In some embodiments, the metallization layers 1234 and the metallization layers 1244 may be patterned copper layers or other suitable patterned metal layers. In one embodiment, the materials of the metallization layers 1234 and the metallization layers 1244 may be the same. In an alternative embodiment, the materials of the metallization layers 1234 and the metallization layers 1244 may be different.

In some embodiments, the bonding pads 1254a are disposed on a surface of the redistribution circuit structure 1230 and connected to a topmost layer of the metallization layers 1234 exposed by openings formed in a topmost layer of the dielectric layers 1232 for electrical connection therebetween, where the bonding pads 1254a are physically separated from each other through the solder mask layer 1252a. Through the redistribution circuit structure 1230, the bonding pads 1254a are electrically connected to the vias 1220 embedded in the core portion 1210. In some embodiments, the bonding pads 1254b are disposed on a surface of the redistribution circuit structure 1240 and connected to a bottommost layer of the metallization layers 1244 exposed by openings formed in a bottommost layer of the dielectric layers 1242 for electrical connection therebetween, where the bonding pads 1254b are physically separated from each other through the solder mask layer 1252b. Through the redistribution circuit structure 1240, the bonding pads 1254b are electrically connected to the vias 1220 embedded in the core portion 1210. The bonding pads 1254a and the bonding pads 1254b may include UBM patterns, however the disclosure is not limited thereto. As shown in FIG. 23, the bonding pads 1254a and the bonding pads 1254b are electrically connected to each other though the vias 1220, the redistribution circuit structure 1230, and redistribution circuit structure 1240, for example. The circuit element 1200 may be referred to as an interposer, in the disclosure.

In some embodiments, a plurality of conductive terminals 1400 are formed on the bonding pads 254b. As shown in FIG. 23, for example, the conductive terminals 1400 are physically and electrically connected to the bonding pads 1254b. Through the bonding pads 1254b, some of the conductive terminals 1400 are electrically connected to some of the bonding pads 1254a. In some embodiments, the conductive terminals 1400 are, for example, chip connectors or BGA balls.

Continued on FIG. 23, in some embodiments, the package structure P1' is physically connected to the circuit element 1200 through connecting the conductive terminals 1160 and the bonding pads 1254a of the circuit element 1200, and the circuit element 1200 is physically connected to the substrate 1500 through connecting the conductive terminals 1400 and the contact pads 1510 of the substrate 1500. In other words, the package structure P1' is electrically connected to the circuit element 1200 through the conductive terminals 1160 and the bonding pads 254a, the circuit element 1200 is electrically connected to the substrate 1500 through the conductive terminals 1400 and the contact pads 1510, so that the package structure P1' is electrically connected to the substrate 1500 through the circuit element 1200. In such embodiments, the conductive terminals 1160 are, for example, micro-bumps, while the conductive terminals 1400 are chip connectors and the conductive terminals 1600 are solder balls or BGA balls. In certain embodiments, the package structure P3 may be formed by CoWoS packaging processes. Owing to the semiconductors device SD3, the package structure P3 achieves a better power integrity and power density network without scarifying the counts of conductive connectors (e.g., the counts of the conductive terminals 1160 included in the package structure P1'), thereby improving power delivery and system performance for the package structure P1' included in the package structure P3.

In some embodiments, an underfill 1300 is optionally formed on the circuit element 1200. As shown in FIG. 23, for example, the underfill 1300 at least fills the gaps between the package structure P1' and the circuit element 1200, and wraps sidewalls of the conductive terminals 1160. In some alternative embodiments, a sidewall of the package structure P1' may further covered by the underfill 1300, the disclosure is not limited thereto. The underfill 1300 may be any acceptable material, such as a polymer, epoxy, molding underfill, or the like, for example. In one embodiment, the underfill 1300 may be formed by underfill dispensing or any other suitable method. Owing to the underfill 1300, the bonding strength between the package structure P1' and the circuit element 1200 are enhanced. However, the disclosure is not limited thereto, the underfill 1300 may be omitted.

In alternative embodiments, another optional underfill (not shown) may be applied to fill the gap between the circuit element 1200 and the substrate 1500 and/or the gap between the semiconductor device SD2 and the substrate 1500, which enhances the bonding strength therebetween. The reliability of the package structure P3 can be improved. The material of each of the optional underfills as described in FIG. 22 and FIG. 23 may be similar to or the same as the material of the underfill 1300 herein.

In accordance with some embodiments, a semiconductor device includes a stacked structure, first conductive terminals and second conductive terminals. The stacked structure includes a first semiconductor component having a first area and a second semiconductor component stacked on the first semiconductor component and having a second area smaller than the first area, wherein an extending direction of the first area and an extending direction of the second area are perpendicular to a stacking direction of the first semiconductor component and the second semiconductor component. The first conductive terminals are located on the stacked structure, electrically coupled to the first semiconductor component and aside of the second semiconductor component. The second conductive terminals are located on the stacked structure and electrically coupled to the second semiconductor component.

In accordance with some embodiments, a semiconductor device includes a first semiconductor component, a second semiconductor component, a first conductive terminal and a second conductive terminal. The first semiconductor component has a first capacitance. The second semiconductor component is stacked on the first semiconductor component and has a second capacitance smaller than the first capacitance. The first conductive terminal is located on and electrically coupled to the first semiconductor component. The second conductive terminal is located on and electrically coupled to the second semiconductor component. A height of the first conductive terminal is greater than a sum of a height of the second semiconductor component and a height of the second conductive terminal.

In accordance with some embodiments, a method of manufacturing semiconductor device includes the following steps, providing a first semiconductor component of a first area; disposing a second semiconductor component of a second area over the first semiconductor component, the second area being smaller than the first area, and the an extending direction of the first area and an extending direction of the second area being perpendicular to a stacking direction of the first semiconductor component and the second semiconductor component; forming first conductive terminals on the first semiconductor component and aside of the second semiconductor component, the first conductive terminals electrically coupling to the first semiconductor component; and forming second conductive terminals on the second semiconductor component, the second conductive terminals electrically coupling to the second semiconductor component.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a stacked structure, comprising:
      a first semiconductor component, having a first area; and
      a second semiconductor component, stacked on the first semiconductor component and having a second area smaller than the first area, wherein an extending direction of the first area and an extending direction of the second area are perpendicular to a stacking direction of the first semiconductor component and the second semiconductor component;
   first conductive terminals, located on the stacked structure, electrically coupled to the first semiconductor component and aside of the second semiconductor component;
   second conductive terminals, located on the stacked structure and electrically coupled to the second semiconductor component; and
   a dielectric layer, covering the first conductive terminals and the second conductive terminals, wherein the dielectric layer has a first surface and a second surface opposite to the first surface, the first surface is closer to the first semiconductor component than the second surface is, and the first conductive terminals and the second conductive terminals protrude out of the second surface of the dielectric layer.

2. The semiconductor device of claim 1, wherein a sidewall of the second semiconductor component is offset from a sidewall of the first semiconductor component.

3. The semiconductor device of claim 2, wherein the sidewall of the second semiconductor component is indented from the sidewall of the first semiconductor component.

4. The semiconductor device of claim 1, wherein the first conductive terminals each have a first height greater than a second height of the second semiconductor component along the stacking direction.

5. The semiconductor device of claim 1, wherein the second semiconductor component is embedded in the dielectric layer, and a sidewall of the dielectric layer is aligned with a sidewall of the first semiconductor component.

6. The semiconductor device of claim 1, wherein the first conductive terminals are arranged in an array and positioning at a side of the first semiconductor component.

7. The semiconductor device of claim 1, wherein a first group of the first conductive terminals and a second group of the first conductive terminals are respectively arranged at two opposite sides of the first semiconductor component.

8. The semiconductor device of claim 1, wherein a first group of the first conductive terminals and a second group of the first conductive terminals are respectively arranged at two adjacently connected sides of the first semiconductor component.

9. The semiconductor device of claim 1, wherein the first conductive terminals are arranged in a form of U-shape surrounding three sides of the first semiconductor component.

10. The semiconductor device of claim 1, wherein the first conductive terminals are arranged in a form of frame-shape surrounding a periphery of the first semiconductor component.

11. The semiconductor device of claim 1, wherein a sidewall of the dielectric layer is aligned with a sidewall of the first semiconductor component, and the dielectric layer continuously extends from a sidewall of the second semiconductor component to a sidewall of the first semiconductor component.

12. The semiconductor device of claim 1, wherein the dielectric layer is in contact with a top surface of the second semiconductor component and a top surface of the first semiconductor component exposed by the second semiconductor component.

13. A semiconductor device, comprising:
   a first semiconductor component, having a first capacitance;
   a second semiconductor component, stacked on the first semiconductor component and having a second capacitance smaller than the first capacitance;
   a first conductive terminal, located on and electrically coupled to the first semiconductor component;
   a second conductive terminal, located on and electrically coupled to the second semiconductor component; and
   an insulating encapsulation, covering the first conductive terminal and the second conductive terminal, wherein the insulating encapsulation has a first surface and a second surface opposite to the first surface, the first surface is closer to the first semiconductor component than the second surface is, and the first conductive terminal and the second conductive terminal protrude out of the second surface of the insulating encapsulation,
   wherein a height of the first conductive terminal is greater than a sum of a height of the second semiconductor component and a height of the second conductive terminal.

14. The semiconductor device of claim 13,
   wherein the insulating encapsulation embeds the second semiconductor component, and a sidewall of the insulating encapsulation is aligned with a sidewall of the first semiconductor component,
   wherein the insulating encapsulation continuously extends from a sidewall of the second semiconductor component to the sidewall of the first semiconductor component, and the insulating encapsulation is in contact with a top surface of the second semiconductor component and a top surface of the first semiconductor component exposed by the second semiconductor component.

15. The semiconductor device of claim 13, wherein the first conductive terminal comprises a plurality of first conductive terminals arranged aside of at least one of four edges of the second semiconductor component.

16. The semiconductor device of claim 13, wherein a first width of the first conductive terminal is substantially equal to a second width of the second conductive terminal along a direction perpendicular to a stacking direction of the first semiconductor component and the second semiconductor component.

17. The semiconductor device of claim 13, wherein a first capacitance density of the first semiconductor component is substantially equal to a second capacitance density of the second semiconductor component.

18. A method of manufacturing a semiconductor device, comprising:
   providing a first semiconductor component of a first area;
   disposing a second semiconductor component of a second area over the first semiconductor component to form a stacked structure, the second area being smaller than the first area, and an extending direction of the first area and an extending direction of the second area being perpendicular to a stacking direction of the first semiconductor component and the second semiconductor component;

forming a dielectric layer over the first semiconductor component and the second semiconductor component;

forming first conductive terminals on the first semiconductor component and aside of the second semiconductor component, the first conductive terminals electrically coupling to the first semiconductor component, and the dielectric layer covering the first conductive terminals; and forming second conductive terminals on the second semiconductor component, the second conductive terminals electrically coupling to the second semiconductor component, and the dielectric layer covering the second conductive terminals, wherein the dielectric layer has a first surface and a second surface opposite to the first surface, the first surface is closer to the first semiconductor component than the second surface is, and the first conductive terminals and the second conductive terminals protrude out of the second surface of the dielectric layer.

19. The method of claim 18, wherein:

providing the first semiconductor component comprises providing a first wafer comprising the first semiconductor component of the first area, and the method further comprises:

patterning the dielectric layer to form a plurality of openings penetrating through the dielectric layer and exposing the first semiconductor component and the second semiconductor component prior to forming the first conductive terminals and forming the second conductive terminals, wherein the first conductive terminals and the second conductive terminals are formed to penetrate through the dielectric layer via the plurality of openings for respectively contacting the first semiconductor component and the second semiconductor component, thinning the first wafer from a side opposite to the second semiconductor component stacked thereon after forming the first conductive terminals and forming the second conductive terminals; and dicing the first wafer to form the semiconductor device having the stacked structure comprising the first semiconductor component and the second semiconductor component stacked thereon, wherein a sidewall of the dielectric layer is aligned with a sidewall of the first semiconductor component.

20. The method of claim 18, wherein prior to disposing the second semiconductor component, the method further comprises:

providing a second wafer having the second semiconductor component of the second area, the second wafer comprising an active surface and a backside surface opposite thereto;

thinning the second wafer from the backside surface; and dicing the second wafer to form the second semiconductor component.

* * * * *